United States Patent
Tseng et al.

(10) Patent No.: US 12,400,715 B2
(45) Date of Patent: Aug. 26, 2025

(54) NON-VOLATILE 3D MEMORY SEARCH ARCHITECTURE

(71) Applicant: MACRONIX INTERNATIONAL CO., LTD., Hsinchu (TW)

(72) Inventors: Po-Hao Tseng, Taichung (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 176 days.

(21) Appl. No.: 18/367,075

(22) Filed: Sep. 12, 2023

(65) Prior Publication Data

US 2025/0087268 A1    Mar. 13, 2025

(51) Int. Cl.
*G11C 16/04* (2006.01)
*G11C 5/06* (2006.01)
*G11C 16/10* (2006.01)

(52) U.S. Cl.
CPC .......... *G11C 16/0483* (2013.01); *G11C 5/063* (2013.01); *G11C 16/10* (2013.01)

(58) Field of Classification Search
CPC ..... G11C 16/0483; G11C 5/063; G11C 16/10; G11C 7/1006; G11C 11/5628; G11C 11/5642; G11C 16/24; G11C 16/26
See application file for complete search history.

(56) References Cited

U.S. PATENT DOCUMENTS

| | | |
|---|---|---|
| 6,317,349 B1 | 11/2001 | Wong |
| 7,050,317 B1 | 5/2006 | Lien et al. |
| 2009/0190404 A1* | 7/2009 | Roohparvar ....... G11C 16/0483 365/49.17 |
| 2022/0108748 A1 | 4/2022 | Tseng et al. |
| 2023/0036141 A1 | 2/2023 | Tseng et al. |
| 2023/0063076 A1 | 3/2023 | Choi |
| 2023/0238061 A1 | 7/2023 | Lin et al. |
| 2023/0395148 A1 | 12/2023 | Tseng |

OTHER PUBLICATIONS

Tseng et al., "In-Memory Approximate Computing Architecture Based on 3D-NAND Flash Memories," 2022 IEEE Symposium on VLSI Technology and Circuits (VLSI Technology and Circuits), Honolulu, HI, USA, Jun. 12-17, 2022, pp. 270-271.

(Continued)

*Primary Examiner* — Xiaochun L Chen
(74) *Attorney, Agent, or Firm* — Korbin S Van Dyke; Haynes Beffel & Wolfeld LLP

(57) ABSTRACT

A non-volatile 3D memory search architecture provides for receiving searches for application to select lines and word lines of a non-volatile 3D memory array. The architecture uses two word lines per unit of information of the searches and two memory devices per unit of stored feature to search against. The architecture uses respective bit lines of the non-volatile 3D memory array as respective matching lines for searching. Respective memory strings (e.g., NAND memory strings) of the non-volatile 3D memory array are usable to store respective data values, e.g., corresponding to elements to search for. Respective pluralities of the memory strings are coupled in parallel to respective shared bit lines. The architecture has applicability to comparing and sorting, in addition to searching in application areas such as artificial intelligence (AI) and big data.

20 Claims, 38 Drawing Sheets

(56) References Cited

OTHER PUBLICATIONS

Tseng et al., "In-Memory-Searching Architecture Based on 3D-NAND Technology with Ultra-high Parallelism," 2020 IEEE International Electron Devices Meeting (IEDM), San Francisco, CA, USA, Dec. 12-18, 2020, pp. 36.1.1-36.1.4.

U.S. Appl. No. 18/760,123 "Memory Device and Memory System" filed Jul. 1, 2024, 71 pages.

* cited by examiner

| Search Input | WL | WL' |
|---|---|---|
| "0" | VL | VH |
| "1" | VH | VL |
| Wildcard | VL | VL |
| Invalid | VH | VH |

| Stored Data | FG | FG' |
|---|---|---|
| "0" | LVT | HVT |
| "1" | HVT | LVT |
| Don't Care | HVT | HVT |
| Invalid | LVT | LVT |

| Search Input | WL | WL' | Stored Data | FG | FG' |
|---|---|---|---|---|---|
| "0" | V0 | V7 | "0" | Vt 0 | Vt 7 |
| "1" | V1 | V6 | "1" | Vt 1 | Vt 6 |
| "2" | V2 | V5 | "2" | Vt 2 | Vt 5 |
| "3" | V3 | V4 | "3" | Vt 3 | Vt 4 |
| "4" | V4 | V3 | "4" | Vt 4 | Vt 3 |
| "5" | V5 | V2 | "5" | Vt 5 | Vt 2 |
| "6" | V6 | V1 | "6" | Vt 6 | Vt 1 |
| "7" | V7 | V0 | "7" | Vt 7 | Vt 0 |
| Wildcard | V0 | V0 | Don't Care | Vt 7 | Vt 7 |
| Invalid | V8 | V8 | Invalid | Vt 0 | Vt 0 |

| | Invalid | I8+I1 | I7+I2 | I6+I3 | I5+I4 | I4+I5 | I3+I6 | I2+I7 | I1+I8 | I1+I1 |
|---|---|---|---|---|---|---|---|---|---|---|
| Wild card | | Ioff | Ioff | Ioff | Ioff | Ioff | Ioff | Ioff | Ioff | Ioff |
| Input 7 | | I7 | I6 | I5 | I4 | I3 | I2 | I1 | Ioff | Ioff |
| Input 6 | | I6 | I5 | I4 | I3 | I2 | I1 | Ioff | I1 | Ioff |
| Input 5 | | I5 | I4 | I3 | I2 | I1 | Ioff | I1 | I2 | Ioff |
| Input 4 | | I4 | I3 | I2 | I1 | Ioff | I1 | I2 | I3 | Ioff |
| Input 3 | | I3 | I2 | I1 | Ioff | I1 | I2 | I3 | I4 | Ioff |
| Input 2 | | I2 | I1 | Ioff | I1 | I2 | I3 | I4 | I5 | Ioff |
| Input 1 | | I1 | Ioff | I1 | I2 | I3 | I4 | I5 | I6 | Ioff |
| Input 0 | | Ioff | I1 | I2 | I3 | I4 | I5 | I6 | I7 | Ioff |
| | Stored 0 | Stored 1 | Stored 2 | Stored 3 | Stored 4 | Stored 5 | Stored 6 | Stored 7 | Stored Don't Care | |

FIG. 6C

| Search Input | WL | WL' |
|---|---|---|
| "0" | V0 | Vp |
| "1" | V1 | Vp-1 |
| "2" | V2 | Vp-2 |
| "3" | V3 | Vp-3 |
| → | → | → |
| "p-2" | Vp-2 | V2 |
| "p-1" | Vp-1 | V1 |
| "p" | Vp | V0 |
| Wildcard | V0 | V0 |
| Invalid | Vp+1 | Vp+1 |

| Stored Data | FG | FG' |
|---|---|---|
| "0" | Vt 0 | Vt p |
| "1" | Vt 1 | Vt p-1 |
| "2" | Vt 2 | Vt p-2 |
| "3" | Vt 3 | Vt p-3 |
| → | → | → |
| "p-2" | Vt p-2 | Vt 2 |
| "p-1" | Vt p-1 | Vt 1 |
| "p" | Vt p | Vt 0 |
| Don't Care | Vt p | Vt p |
| Invalid | Vt 0 | Vt 0 |

| Search Data | WL | WL' |
|---|---|---|
| "0" | VL | VH |
| "1" | VH | VL |
| Wildcard | VH | VH |
| Invalid | VL | VL |

| Stored Data | FG | FG' |
|---|---|---|
| "0" | LVT | HVT |
| "1" | HVT | LVT |
| Don't Care | LVT | LVT |
| Invalid | HVT | HVT |

| Search Input | WL | WL' |
|---|---|---|
| "0" | V7 | V0 |
| "1" | V6 | V1 |
| "2" | V5 | V2 |
| "3" | V4 | V3 |
| "4" | V3 | V4 |
| "5" | V2 | V5 |
| "6" | V1 | V6 |
| "7" | V0 | V7 |
| Wildcard | V7 | V0 |

| Stored Data | FG | FG' |
|---|---|---|
| "0" | Vt 0 | Vt 7 |
| "1" | Vt 1 | Vt 6 |
| "2" | Vt 2 | Vt 5 |
| "3" | Vt 3 | Vt 4 |
| "4" | Vt 4 | Vt 3 |
| "5" | Vt 5 | Vt 2 |
| "6" | Vt 6 | Vt 1 |
| "7" | Vt 7 | Vt 0 |
| Don't Care | Vt 0 | Vt 0 |

FIG. 10C

| Search Input | WL | WL' |
|---|---|---|
| "0" | Vp | V0 |
| "1" | Vp-1 | V1 |
| "2" | Vp-2 | V2 |
| "3" | Vp-3 | V3 |
| ↓ | ↓ | ↓ |
| "p-2" | V2 | Vp-2 |
| "p-1" | V1 | Vp-1 |
| "p" | V0 | Vp |
| Wildcard | Vp | Vp |

| Stored Data | FG | FG' |
|---|---|---|
| "0" | Vt 0 | Vt p |
| "1" | Vt 1 | Vt p-1 |
| "2" | Vt 2 | Vt p-2 |
| "3" | Vt 3 | Vt p-3 |
| ↓ | ↓ | ↓ |
| "p-2" | Vt p-2 | Vt 2 |
| "p-1" | Vt p-1 | Vt 1 |
| "p" | Vt p | Vt 0 |
| Don't Care | Vt 0 | Vt 0 |

NON-VOLATILE 3D MEMORY SEARCH ARCHITECTURE

BACKGROUND

Field

This disclosure relates to 3D in-memory searching, implementable using 3D-NAND memory and as applicable to big data and/or artificial intelligence (AI) processing.

Description of Related Art

Growth of big data and AI (such as AI hardware accelerators) are increasing the importance of searching, comparing, and/or sorting data. Conventional systems implement concurrent searching using ternary content addressable memory (TCAM) technology.

Conventional TCAM technology is implementable using static randomly accessible memory (SRAM) techniques, and thus has relatively low memory density (such as 16 transistors to form a single TCAM cell) and relatively high power usage.

Recently proposed TCAM technology is implementable using non-volatile memory techniques, such as based on two transistor two resistor (2T2R) techniques and two ferroelectric field-effect transistor (2FeFET) techniques. However, the non-volatile-implemented TCAM techniques require paired memory for a single TCAM cell (or paired memory cells to implement one search bit or one data bit) and therefore efficiency of searching and data storage is limited.

Example techniques using NAND-flash-based in-memory searching functions enabled to perform exact matching and approximate matching operations are described in P. H. Tseng et al., In-Memory-Searching Architecture Based on 3D-NAND Technology with Ultra-high Parallelism, 2020 IEDM; and P. H. Tseng et al., In-Memory Approximate Computing Architecture Based on 3D-NAND Flash Memories, 2022 VLSI.

Thus, techniques are needed that enable high performance searching, comparing, and/or sorting, such as relating to big data and/or AI processing.

SUMMARY

A system of one or more computers is configurable to perform particular operations or actions by virtue of having software, firmware, hardware, or a combination of them installed on the system that in operation causes or cause the system to perform the particular operations or actions. One or more computer programs is configurable to perform particular operations or actions by virtue of including instructions that, when executed by data processing apparatus, cause the apparatus to perform the particular operations or actions.

A first aspect includes a computing system that includes a bit line and a source line; a pair of memory strings that includes a first memory string and a second memory string connected in parallel between the bit line and the source line, where the first memory string includes at least one select device that is responsive to a select input and that is series-connected with a plurality of series-connected programmable devices, each being responsive to a respective programmed state and a respective control input, and where the second memory string is identical to the first memory string; a sense amplifier connected to the bit line and enabled to provide an indication of one of a plurality of matching indications; data encoding circuitry enabled to provide programming data to the programmable devices of the first memory string and the second memory string responsive to at least one data input and in accordance with a selected encoding; and search encoding circuitry enabled (i) to drive the select inputs of the first memory string and the second memory string responsive to a search scope of search criteria and (ii) to drive, in accordance with the selected encoding, the control inputs responsive to a search value of the search criteria, where the pair of memory strings is enabled to couple the bit line and the source line via a respective one of a plurality of string pair currents responsive to the select inputs, the control inputs, and the programmed states of the first memory string and the second memory string, where the string pair currents include an exact-match current and a no-match current, and where the matching indications include an exact-match that is indicated responsive to the exact-match current and a no-match that is indicated responsive to the no-match current. Other variations of this aspect include corresponding computer systems, apparatus, and computer programs recorded on one or more computer storage devices, each configured to perform the actions of the methods.

Variations optionally include one or more of the following features. The computing system where the string pair currents further include at least one partial-match current, and the matching indications further include at least one partial-match that is indicated responsive to the at least one partial-match current. The plurality of series-connected programmable devices is arranged in a plurality of layers, the search encoding circuitry is further enabled to drive the select inputs of the first memory string and the second memory string responsive to a search depth of the search criteria, and the search depth indicates how many of the layers to search. The search encoding circuitry is further enabled to drive the select inputs of the first memory string and the second memory string responsive to a search start of the search criteria, and the search start indicates which of the layers to begin to search. The page buffer further includes a priority encoder enabled to priority encode match results of the plurality of sense amplifiers. The exact-match current is larger than the no-match current. The exact-match current is smaller than the no-match current. Each programmable device of the plurality of series-connected programmable devices is programmable via adjustment of a respective threshold voltage to one of at least two threshold levels, the selected encoding indicates respectively how to encode a binary zero and a binary one to two respective ones of the at least two threshold levels, and the at least two threshold levels are mutually distinguishable. Each programmable device of the plurality of series-connected programmable devices is programmable via adjustment of a respective threshold voltage to one of at least eight threshold levels, the selected encoding indicates respectively how to encode an octal zero, an octal one, an octal two, an octal three, an octal four, an octal five, an octal six, and an octal seven to eight respective ones of the at least eight threshold levels, and the at least eight threshold levels are mutually distinguishable. Each programmable device of the plurality of series-connected programmable devices is programmable via adjustment of a respective threshold voltage to one of a plurality of analog threshold levels, the selected encoding indicates respectively how to encode respective analog data values to respective ones of the analog threshold levels, and the analog threshold levels are mutually distinguishable. The data encoding circuitry is further enabled, responsive to the at least one data input and in accordance with the selected encoding, to provide additional programming data (1) to the programmable devices of the first memory string of the plurality of memory string pairs, and (2) to the programmable devices of the second memory string of the plurality of memory string pairs. The computing system includes a plurality of 2d memory arrays, a first of which includes the plurality of memory string pairs and the pair of memory strings. Each of the bit lines of the 2d memory arrays is connected to a respective one of the plurality of sense amplifiers. The computing system includes a page buffer that includes a priority encoder enabled to priority encode match results of the plurality of sense amplifiers. Variations of the described techniques optionally include hardware, a method or process, or computer software on a computer-accessible medium.

A second aspect includes a computing method that includes receiving at least one data input; receiving search criteria that include a search scope and a search value; providing programming data, in accordance with a selected encoding, to programmable devices of a first memory string and a second memory string responsive to the at least one data input; driving select inputs of the first memory string and the second memory string responsive to the search scope; driving control inputs of the first memory string and the second memory string in accordance with the selected encoding and responsive to the search value; sensing a bit line to provide an indication of one of a plurality of matching indications, and where the first memory string and the second memory string are connected in parallel between the bit line and a source line; providing the indication as an output, where a pair of memory strings include the first memory string and the second memory string, the first memory string includes at least one select device that is responsive to one of the select inputs and that is series-connected with a plurality of series-connected programmable devices, each being responsive to a respective programmed state and a respective one of the control inputs, and the second memory string being identical to the first memory string, where the pair of memory strings is enabled to couple the bit line and the source line via a respective one of a plurality of string pair currents responsive to the select inputs, the control inputs, and programmed states of the first memory string and the second memory string, where the string pair currents include an exact-match current and a no-match current, and where the matching indications include an exact-match that is indicated responsive to the exact-match current and a no-match that is indicated responsive to the no-match current. Other variations of this aspect include corresponding computer systems, apparatus, and computer programs recorded on one or more computer storage devices, each configured to perform the actions of the methods.

Variations optionally include one or more of the following features. The computing method where the string pair currents further include a partial-match current, and the matching indications further include a partial-match that is indicated responsive to the partial-match current. The plurality of series-connected programmable devices is arranged in a plurality of layers, the search criteria further include a search depth, the driving the control inputs is further responsive to the search depth, and the search depth indicates how many of the layers to search. Variations of the described techniques optionally include hardware, a method or process, or computer software on a computer-accessible medium.

A third aspect includes a search memory that includes a plurality of sense amplifiers; a plurality of two-dimensional memory arrays each include: a respective bit line connected to a respective one of the sense amplifiers, a respective source line, and a respective plurality of memory strings each coupled to (a) the respective bit line and (b) the respective source line, and each memory string includes (1) a respective plurality of series-connected floating-gate transistors each having and being responsive to (c) a respective configured state and (d) a respective control input, and includes (2) a respective select device connected in series between the respective plurality of series-connected floating-gate transistors and the respective bit line, and where each select device has and is responsive to a respective select line. The memory includes a plurality of word lines each coupled to a respective one of the respective control inputs of each of the series-connected floating-gate transistors; a data encoder enabled to provide programming data to the series-connected floating-gate transistors and responsive to at least one data input and in accordance with a selected encoding; a search encoder enabled to receive a search and drive the word lines according to the search and the selected encoding, and further enabled to drive the select lines according to the search; and where (e) each respective memory string is enabled to drive the respective bit line and source line that the respective memory string is coupled to via a match-found current responsive to the configured states of the memory string exactly matching the respective control inputs of the series-connected floating-gate transistors of the memory string, and (f) each sense amplifier is enabled to generate a respective indication of whether the bit line it is coupled to is coupled to the source line via the match-found current; and where (g) each memory string is further enabled to couple the respective bit line and source line that the memory string is coupled to via a no-match-found current responsive to the configured states of the memory string not exactly matching the respective control inputs of the series-connected floating-gate transistors of the memory string, and (h) each sense amplifier is further enabled to generate a respective indication of whether the bit line it is coupled to is coupled to the source line via the no-match-found current. Other variations of this aspect include corresponding computer systems, apparatus, and computer programs recorded on one or more computer storage devices, each configured to perform the actions of the methods.

Variations optionally include one or more of the following features. The search memory where the respective memory string is further enabled to couple the respective bit line and source line that the memory string is coupled to via a partial-match-found current that is responsive to the configured states of the respective memory string partially exactly matching the respective control inputs of the series-connected floating-gate transistors of the respective memory string, and each sense amplifier is further enabled to generate a respective indication of whether the bit line it is coupled to is coupled to the source line via the partial-match-found current. The series-connected floating-gate transistors are arranged in a plurality of layers, the search encoder is further enabled to drive the select lines responsive to a search depth of the search, and the search depth indicates how many of the layers to search. Variations of the described techniques optionally include hardware, a method or process, or computer software on a computer-accessible medium.

BRIEF DESCRIPTION OF THE DRAWINGS

FIGS. 6A, 6B, and 6C collectively illustrate an example of an encoding technique using eight threshold levels and providing a larger current indication for mismatches between search data and stored data.

FIGS. 10A, 10B, and 10C collectively illustrate an example of an encoding technique using eight threshold levels and providing a smaller current indication for mismatches between search data and stored data.

DETAILED DESCRIPTION

Figure 1:
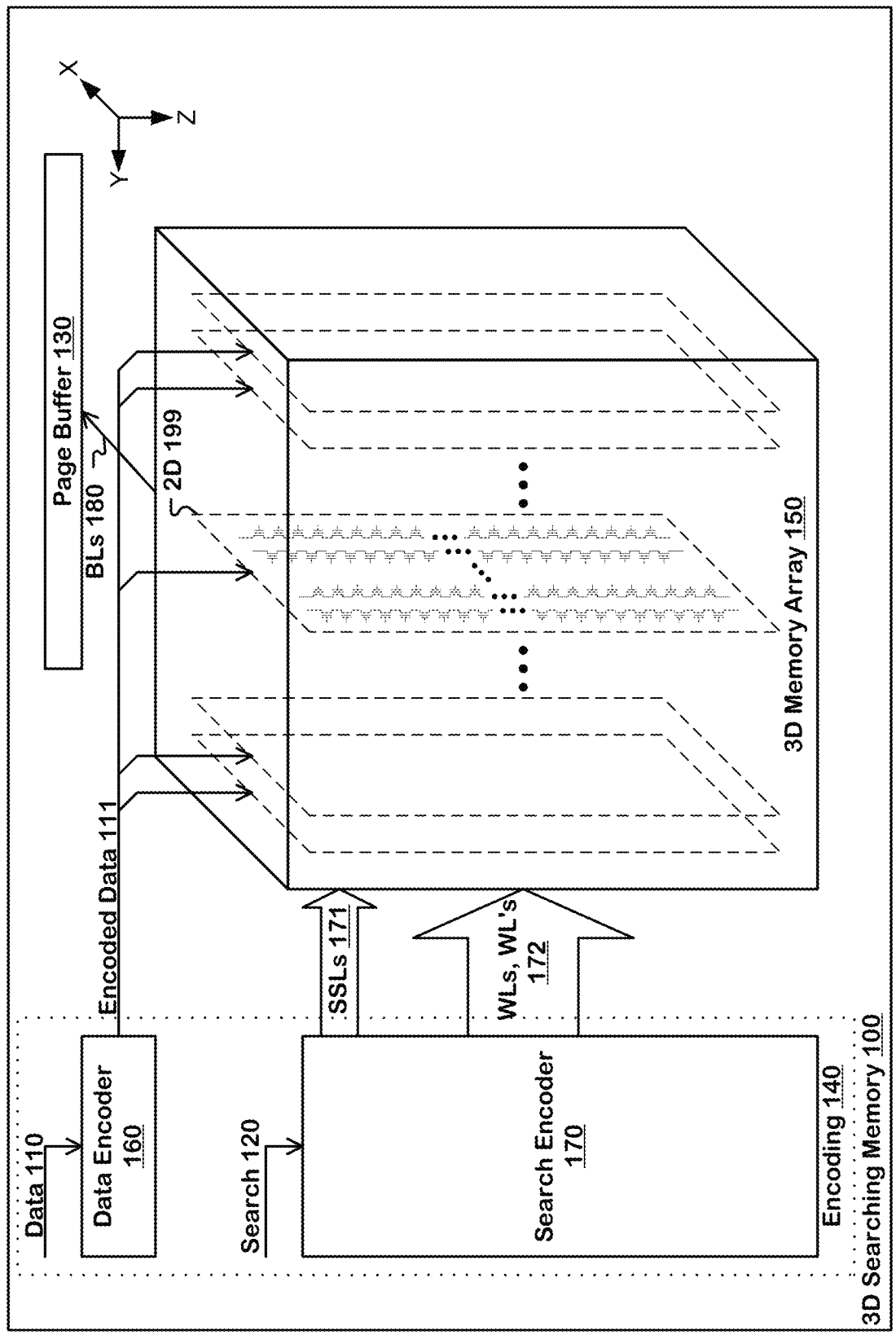
FIG. 1 illustrates an example of a 3D searching memory.

A detailed description of techniques relating to a novel non-volatile 3D memory search architecture is provided with reference to FIGS. 1, 2, 3, 4, 5A, 5B, 6A, 6B, 6C, 7A, 7B, 8, 9A, 9B, 10A, 10B, 10C, 11A, 11B, 12A, 12B, 12C, 13A, 13B, 13C, 14A, 14B, 14C, 15A, 15B, 15C, 15D, 15E, 16A, 16B, 16C, 17A, 17B, 17C, 18A, 18B, 18C, 19, 20, 21, and 22.

The non-volatile 3D memory search architecture provides for receiving searches for application to select lines and word lines of a non-volatile 3D memory array. The architecture uses two word lines per unit of information of the searches and two memory devices per unit of stored feature to search against. The architecture uses respective bit lines of the non-volatile 3D memory array as respective matching lines for searching. Respective memory strings (e.g., NAND memory strings) of the non-volatile 3D memory array are usable to store respective data values, e.g., corresponding to elements to search for. Respective pluralities of the memory strings are coupled in parallel to respective shared bit lines. The architecture has applicability to comparing and sorting, in addition to searching in application areas such as artificial intelligence (AI) and big data.

One or more flow diagrams are described herein. Processing described by the flow diagrams is implementable and/or directable using processors programmed using computer programs stored in memory accessible to computer systems and executable by the processors, using dedicated logic hardware (including field programmable integrated circuits), and using various combinations thereof. Various actions are combinable, performable in parallel, and/or performable in a different sequence without affecting processing achieved. In some cases, a rearrangement of actions achieves identical results only if certain other changes are made as well. In other cases, a rearrangement of actions achieves identical results only if certain conditions are satisfied. Furthermore, for clarity, some of the flow diagrams herein omit certain some actions not necessary for understanding the disclosed techniques. Various additional actions are performable before, after, and/or between the illustrated actions.

Examples of selected acronyms, mnemonics, and abbreviations used in the description are as follows.

| (Acronym/Mnemonic/Abbreviation) | Example |
|---|---|
| (2FeFET) | Two Ferroelectric Field Effect Transistor |
| (2T0C (DRAM-like device)) | Two-Transistor Zero-Capacitor |
| (2T2R) | Two Transistor Two Resistor |
| (AI) | Artificial Intelligence |
| (BL) | Bit Line |
| (CSL) | Common Source Line |
| (DNA) | DeoxyriboNucleic Acid |
| (DRAM) | Dynamic Random Access read/write Memory |
| (FeFET) | Ferroelectric Field-Effect Transistor |
| (GSL) | Ground Select Line |
| (IMS) | In-Memory Search |

| (Acronym/Mnemonic/Abbreviation) | Example |
| --- | --- |
| (NAND) | Not AND; e.g., series connection of devices forming a memory string |
| (NVM) | Non-Volatile Memory |
| (SONOS (memory)) | Silicon-Oxide-Nitride-Oxide-Silicon (memory) |
| (SRAM) | Static Random Access read/write Memory |
| (SSD) | Solid State Drive |
| (SSL) | String Select Line |
| (TCAM) | Ternary Content Accessible Memory |
| (WL) | Word Line |

An example of a memory string is a plurality of series-connected memory devices. An example of a memory device is an element enabled to store information to indicate one of at least two mutually exclusive states of the memory device. The states are settable via programming the memory device and are readable via activating a control input of the memory device. In several types of memory devices (e.g., floating gate memory devices), the programming is via configuring a threshold voltage of the memory device and the control input is a control gate input. The configuring is also referred to as programming the memory device (e.g., to a one or a zero, or some other value), and is also referred to as storing the value (e.g., a one or a zero, or some other value).

An example of a search criteria is a collection of information indicating what to search for and how to perform a search. The search criteria include any combination of a search value, a search depth, a search start, and a search scope. The search value indicates, e.g., what stored value to search for. The search depth indicates, e.g., how many layers of a memory array to search in. The search start indicates, e.g., which of the layers to begin searching in. The search scope indicates, e.g., which of the memory strings to activate for searching.

3D Memory Search Concepts

Disclosed herein is a novel non-volatile 3D memory search implementable using a 3D searching memory (e.g., a 3D-NAND memory) that enables high performance searching, comparing, and/or sorting, such as relating to big data and/or AI processing. The architecture provides for low latency, high resolution, high content density, multi-block functionality, and robust reliability. The architecture is applicable to various fields such as big-data searching, AI hardware accelerators and/or classifiers, approximate computing, associative memory, few-shot learning, SSD data management, DNA matching, data filtering, hyper-dimensional computing, as well as other applications benefiting from in-memory searching enabled for long search words and large data capacities.

A host agent directs storage of data in the 3D searching memory. In response, the 3D searching memory stores the data. Then, the host agent provides searches to the 3D searching memory. In response, the 3D searching memory processes the searches by determining zero or more matches within the stored data in accordance with the searches.

A control agent of the 3D searching memory receives the data for storage from the host agent, and in response directs the 3D searching memory to configure included memory devices to store the data (e.g., via included programming circuitry). The control agent receives the searches, and in response directs one or more 2D memory resources of the 3D searching memory in accordance with the searches, providing search results (e.g., match indications) to the host agent.

Techniques relating to a 3D memory searching architecture enable efficiently searching a 3D searching memory for a match against data stored in the 3D searching memory according to search criteria, such as any combination of a search value, a search depth, a search start, and a search scope. The search value specifies what to search for in a 3D memory array of the 3D searching memory. The 3D memory array comprises a plurality of horizontally-stacked layers. The search depth specifies how many of the layers to search. The search start specifies where, in the stack of layers, to begin the search. The search scope specifies which portions of the 3D memory array to search.

For example, the 3D memory array is implemented using NVM technology, such as comprised of floating-gate programmable memory devices. The three dimensions of the 3D memory array are referred to herein as X, Y, and Z. One or more 3D searching memory and/or 3D memory array instances are implementable as all or any portions of an integrated circuit manufactured from wafer material using planar processing technology. The X and Y dimensions correspond to the horizontal plane of the planar processing. The Z dimension corresponds to the vertical dimension of the planar processing, e.g., vertically stacked layers of material.

The 3D memory array is comprised of a plurality of 2D memory arrays. Each 2D memory array is comprised of a plurality of memory string pairs. Each memory string is comprised of source/drain serially connected non-volatile memory devices each having a respective control gate input. The control gate inputs are connected to respective word lines, operated in pairs according to the pairs of memory strings and respective pairs of devices therein. Each string additionally comprises a string select device source/drain serially connected to the non-volatile memory devices. The string select device has a gate input connected to a string select control input. Each string additionally comprises one or more source/drain serially connected control devices having respective gates and associated control inputs.

Search criteria includes a search value, and optionally any one or more of a search depth, a search start, and a search scope. The search value is what is to be searched for in the 3D searching memory. The search depth is how many (contiguous) layers of the 3D searching memory to search. The search start is from which layer to begin searching. The search scope indicates with string select lines to active for the search.

The search value has a length, such as measured in characters sometimes referred to as digits. The digits are according to a numerical representation base, such as base 2 for binary digits (bits), or such as base 8 for octal digits.

Encoding of search inputs and data values is according to how circuitry determines a match (mismatch), e.g., via large/larger or small/smaller current. For example, a part of a page buffer (e.g., a sense amplifier) determines that a match is indicated by a larger current than a mismatch. For another example, a page buffer determines that a match is indicated by a smaller current than a mismatch.

Encoding of search inputs and data values is further according to unique representations for each digit. Each unique representation corresponds to a level. Encodings are implementable for two-level, eight-level, p-level (multiple-level), and analog techniques.

Techniques relating to 3D memory searching architecture enable high-speed searching for long-word data matches from among a large number of stored values.

In some usage scenarios, read latency of a 3D searching memory is reduced (at the potential expense of a relatively large current transient) by operating multiple blocks concurrently. The concurrent operating is via switching a plurality of activation controls, e.g., string select lines (SSLs).

3D Memory Search Example Implementation

FIG. 1 illustrates an example of a 3D searching memory, as 3D Searching Memory 100. 3D Searching Memory 100 is implemented in three dimensions (X, Y, and Z), comprising encoding, storage/searching, and output resources. The encoding resources comprise Data Encoder 160 (e.g., data encoding circuitry), enabled to receive Data 110 and in response provide Encoded Data 111 (e.g., programming data) to the storage/searching resources. The encoding resources further comprise Search Encoder 170, enabled to receive Search 120 and in response provide string search lines, illustrated as String Select Lines (SSLs) 171 as well as pairs of word lines, illustrated as Word Lines (WLs, WL's) 172 to the storage/searching resources. The encoding performed by the encoding resources is according to a particular encoding technique, as illustrated by dotted box Encoding 140. The storage/searching resources comprise 3D Memory Array 150 that in turn comprises a plurality of instances of 2D memory arrays, one of which is specifically identified as 2D Memory Array (2D) 199. The output resources comprise Page Buffer 130 (that includes, e.g., sense amplifiers), enabled to receive bit line information from each of the 2D memory arrays of 3D Memory Array 150, illustrated as Bit Lines (BLs) 180.

For clarity, the figure omits selected details relating to programming programmable memory devices of the 2D memory arrays.

In some examples, Search Encoder 170 (that includes, e.g., search encoding circuitry) and/or Bit Lines (BLs) 180 are enabled to sequence through layers, e.g., switching searching from layer one to layer two and/or layer seven, and so forth.

Figure 2:
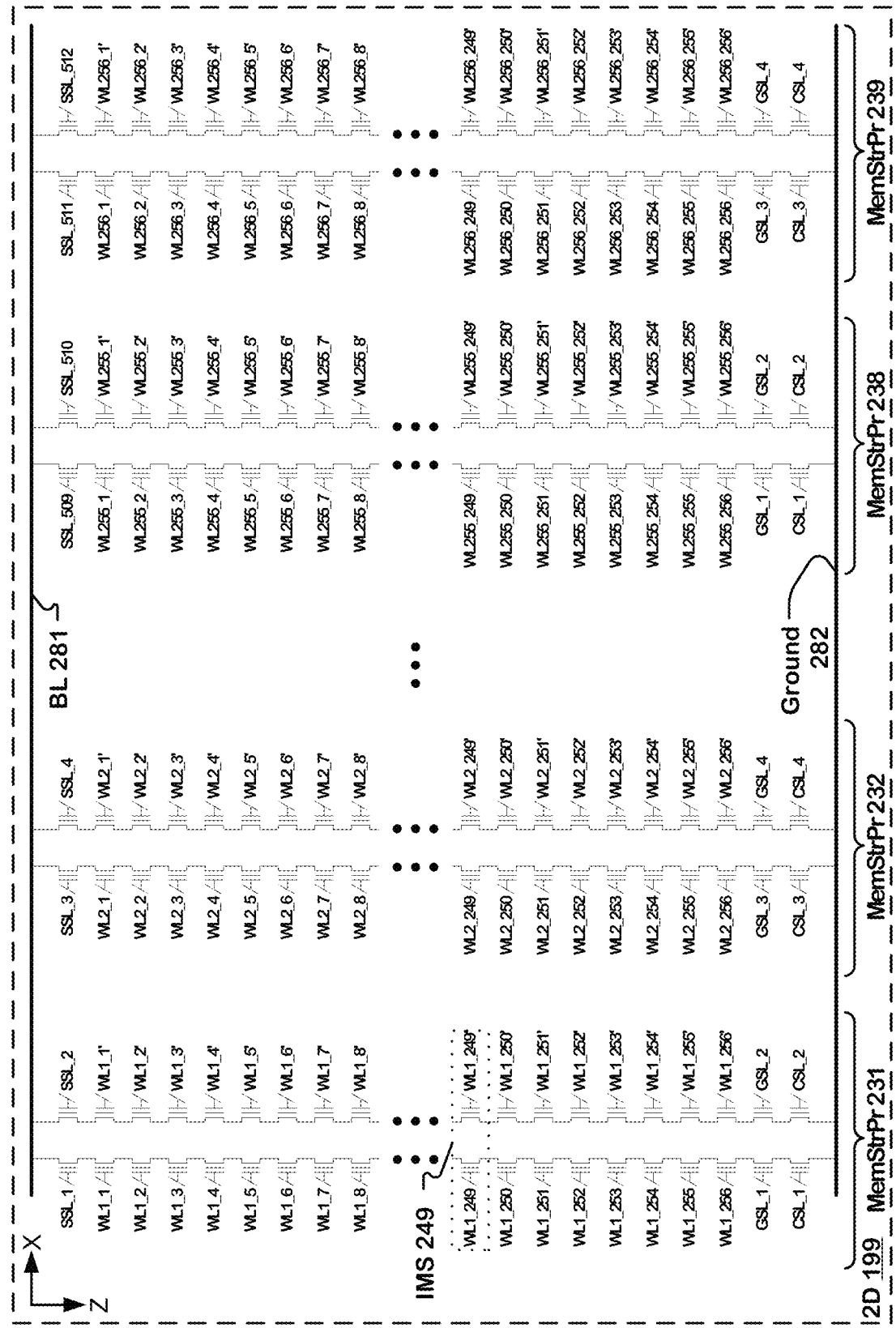
FIG. 2 illustrates selected details of an example of a 2D memory array.

FIG. 2 illustrates selected details of an example of a 2D memory array, as 2D Memory Array (2D) 199.

2D Memory Array (2D) 199 comprises 256 memory string pairs. For clarity, the figure explicitly illustrates four of the pairs, Memory String Pairs (MemStrPr) 231-239. Each of the memory string pairs comprises a series-connected string of devices, connected between Bit Line (BL) 281 and Ground 282. Each series-connected string of devices comprises a plurality of source/drain serially connected non-volatile memory devices, 256 devices total. Each of the non-volatile memory devices has a respective control gate input connected to a respective word line. As a specific example illustrated in the figure, Memory String Pair (MemStrPr) 231 comprises 256 non-volatile memory devices in a left-hand memory string of the memory string pair and 256 non-volatile memory devices in a right-hand string of the memory string pair. For clarity, a subset of the devices are explicitly illustrated.

The control gate inputs of the non-volatile memory devices of the left-hand memory string of Memory String Pair (MemStrPr) 231 are respectively connected to word lines WL1_1 . . . . WL1_256.

Similarly, control gate inputs of the non-volatile memory devices of the right-hand memory string of Memory String Pair (MemStrPr) 231 are respectively connected to word lines WL1_1' . . . . WL1_256'. Note that the apostrophe (') is read as "prime" indicating a relationship between a pair of word lines, e.g., WL1_1 and WL1_1' are related as being coupled to respective memory devices of a same in-memory search cell.

Note that word lines are identified by two integers, CharacterNumber, and LayerNumber, as well as an optional apostrophe suffix: WL<CharacterNumber>_<LayerNumber>[']. For example, WL1_8 corresponds to character 1 (of, e.g., an input search word) and layer 8 (of 3D Memory Array 150). Lack of an apostrophe suffix signifies the left-hand string of a memory string pair. For another example, WL1_8' is corresponds to character 1 and layer 8, identically to WL1_8. The apostrophe suffix signifies the right-hand string of the memory string pair.

As is described in more detail elsewhere herein, the non-volatile memory devices of the left-hand and right-hand memory strings are used in pairs according to a specific encoding technique (such as Encoding 140 of FIG. 1) to perform matching for searching operations. An example of one of the non-volatile memory device pairs is illustrated as In Memory Search cell (IMS) 249. The gate of the left-hand non-volatile device of the pair is connected to WL1_249 and the gate of the right-hand non-volatile device of the pair is connected to WL1_249'.

Each series-connected string of devices additionally comprises a string select device that is source/drain serially connected to the non-volatile memory devices. The string select device has a gate input connected to a string select control input (e.g., SSL_1 of the left-hand memory string of Memory String Pair (MemStrPr) 231 and SSL_2 of the right-hand memory string of Memory String Pair (MemStrPr) 231). The pair of string select lines of each memory string pair (e.g., SSL_1 and SSL_2) is operable as a pair (e.g., responsive to a search operation) to enable (disable) the left-hand and right-hand memory strings of the memory string pair together.

Each series-connected string of devices additionally comprises a ground select device that is source/drain serially connected to the non-volatile memory devices. The ground select device has a gate input connected to a ground select control input (e.g., GSL_1 of the left-hand memory string of Memory String Pair (MemStrPr) 231 and GSL_2 of the right-hand memory string of Memory String Pair (MemStrPr) 231). The pair of ground select lines of each memory string pair (e.g., GSL_1 and GSL_2) is operable as a pair (e.g., responsive to a search operation) to enable (disable) the left-hand and right-hand memory strings of the memory string pair together.

Each series-connected string of devices additionally comprises a common select device that is source/drain serially connected to the non-volatile memory devices. The common select device has a gate input connected to a common select control input (e.g., CSL_1 of the left-hand memory string of Memory String Pair (MemStrPr) 231 and CSL_2 of the right-hand memory string of Memory String Pair (MemStrPr) 231). The pair of common select lines of each memory string pair (e.g., CSL_1 and CSL_2) is operable as a pair (e.g., responsive to a search operation) to enable (disable) the left-hand and right-hand memory strings of the memory string pair together.

Each element of the pair of string select lines of each memory string pair (e.g., SSL_1 and SSL_2) is operable individually (e.g., responsive to other than search operations, such as erase and/or programming operations). For example, SSL_1 is operable independently of SSL2 to enable programming of devices in the left-hand memory string of Memory String Pair (MemStrPr) 231. Similarly, each element of the pair of ground select lines and common select lines is operable individually and/or independently of the other element of the pair.

The figure illustratively depicts 2D Memory Array (2D) 199 as having 256 memory string pairs each having 256 non-volatile memory devices connected in series. Other examples have other numbers of memory string pairs and/or other numbers of non-volatile memory devices connected in series.

Figure 3:
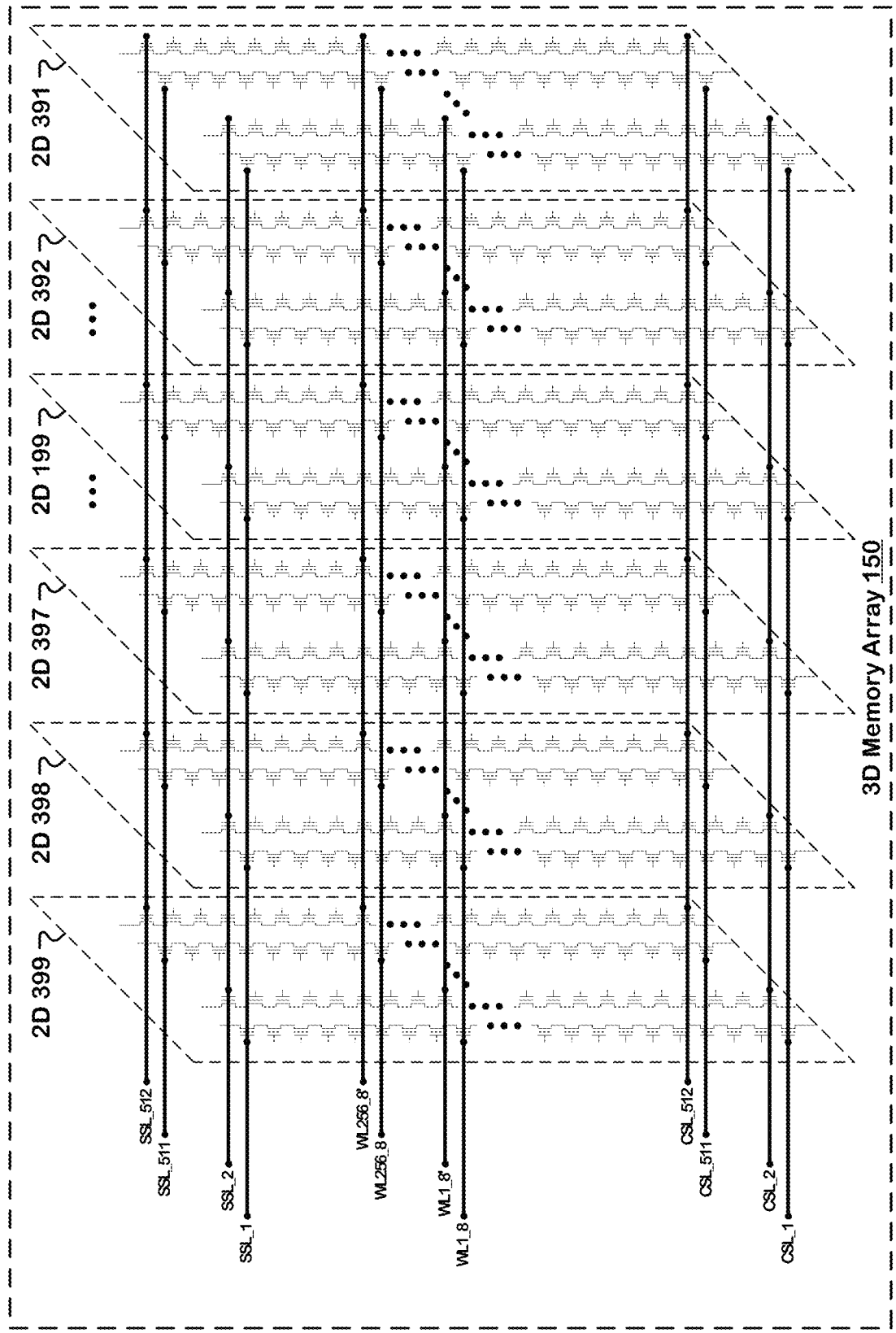
FIG. 3 illustrates selected details of an example 3D memory array.

FIG. 3 illustrates selected details of an example 3D memory array, as 3D Memory Array 150.

The figure illustrates several representative instances of the 2D memory arrays of 3D Memory Array 150, specifically 2D Memory Array (2D) 391, 2D Memory Array (2D) 392, 2D Memory Array (2D) 199, 2D Memory Array (2D) 397, 2D Memory Array (2D) 398, and 2D Memory Array (2D) 399. The figure also illustrates several representative interconnections of the gates of the devices of the 2D memory arrays. Specifically, all the gates of the devices at a particular X, Y location of each of the 2D memory arrays are connected in parallel. The figure illustrates representative parallel connections for string select lines SSL_1, SSL_2, SSL511, and SSL512; word line pair WL1_8 and WL1_8', word line pair WL256_8 and WL256_8'; and common select lines CSL_1, CSL_2, CSL511, and CSL512.

Thus, in an example having 128K 2D memory arrays, each of the string select lines connects to 128K gates, each of the word lines of each word line pair connects to 128K gates, and so forth. Other examples have other numbers of 2D memory arrays.

3D Memory Search In-Memory Search Cell

Figure 4:
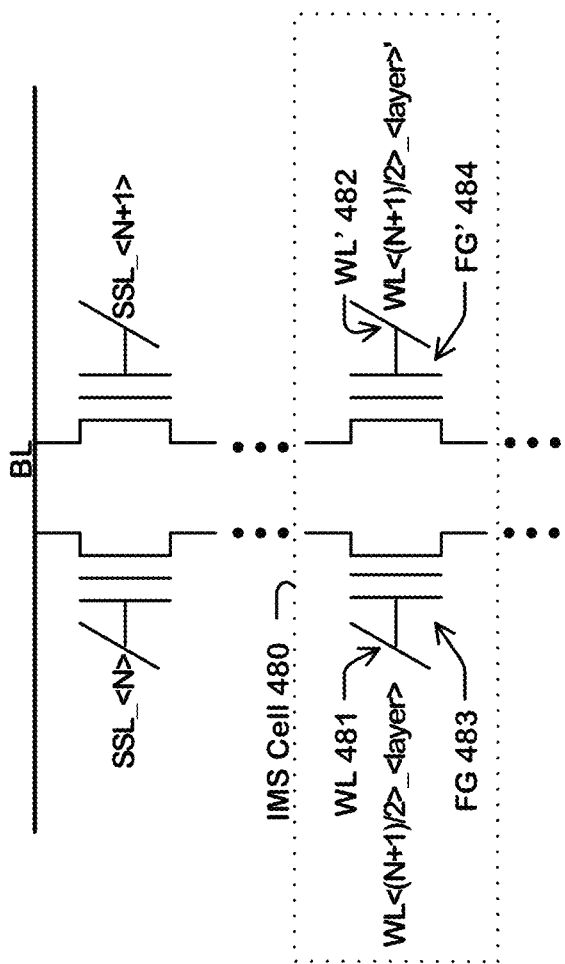
FIG. 4 illustrates in-memory searching in a context of a memory string pair connected to a Bit Line (BL).

FIG. 4 illustrates IMS Cell 480 in a context of a memory string pair connected to a BL. Floating Gate device (FG) 483 (of the left-hand memory string of the memory string pair) is connected to Word Line (WL) 481. Floating Gate device prime (FG') 484 (of the right-hand memory string of the memory string pair) is connected to Word Line prime (WL') 482. Floating Gate device (FG) 483 and Floating Gate device prime (FG') 484 are programmable, e.g., via adjustment of a threshold voltage via charging/discharging an included floating gate. Thus, Floating Gate device (FG) 483 and Floating Gate device prime (FG') 484 are collectively programmable to store various unique symbols referred to as levels.

Figures 5A, 5B:
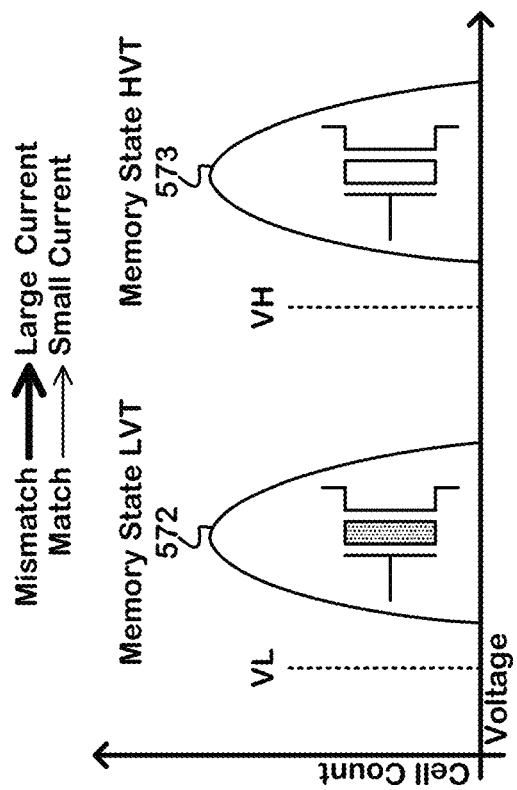
FIGS. 5A and 5B illustrate an example of an encoding technique using two threshold levels and providing a large current indication of a mismatch between search data and stored data.
Figure 8:
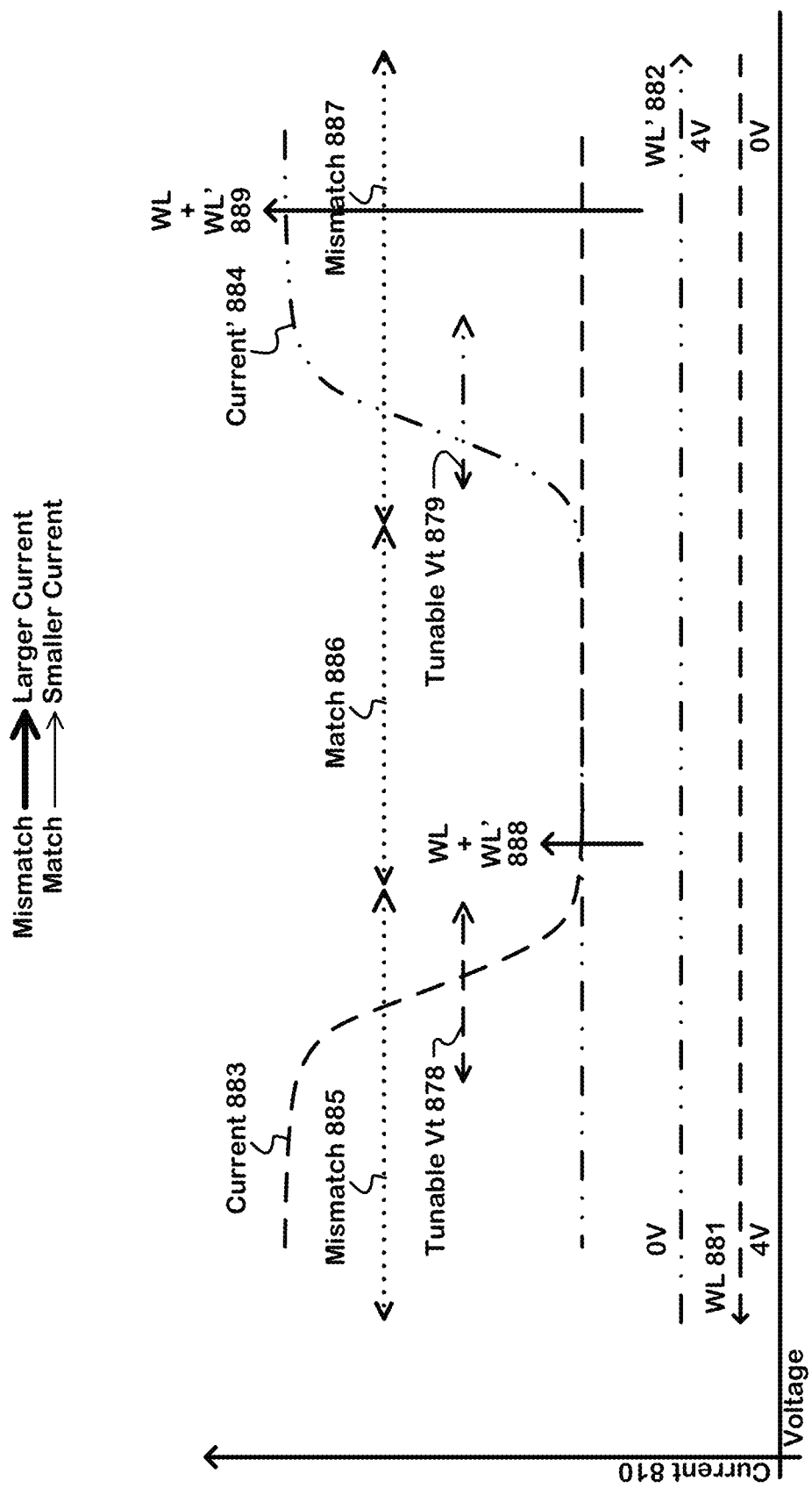
FIG. 8 illustrates an example of an encoding technique using analog levels and providing a larger current indication for mismatches between search data and stored data.
Figures 9A, 9B:
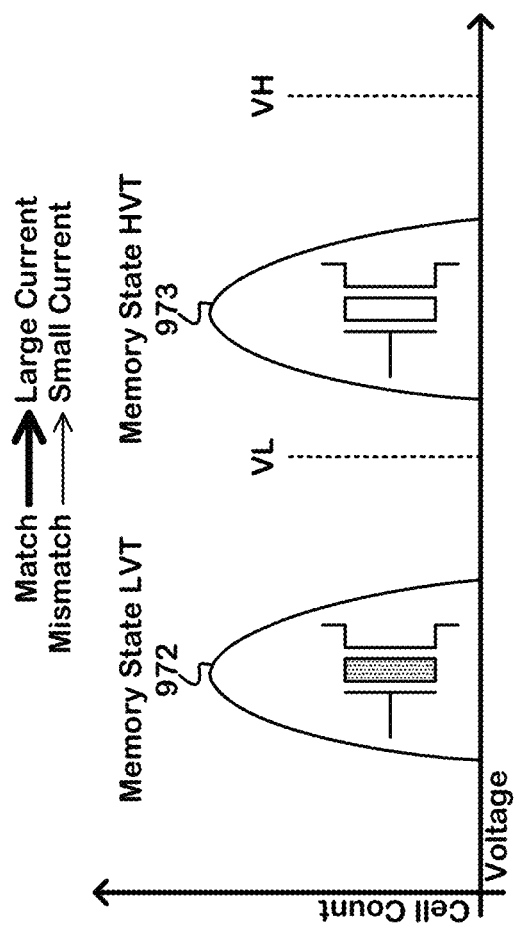
FIGS. 9A and 9B illustrate an example of an encoding technique using two threshold levels and providing a small current as an indication of a mismatch between search data and stored data.
Figures 10A, 10B:
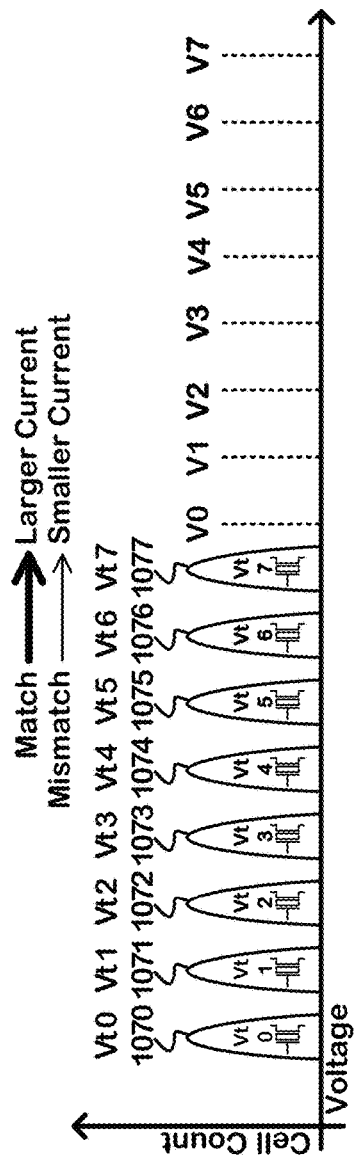
Figure 10C:
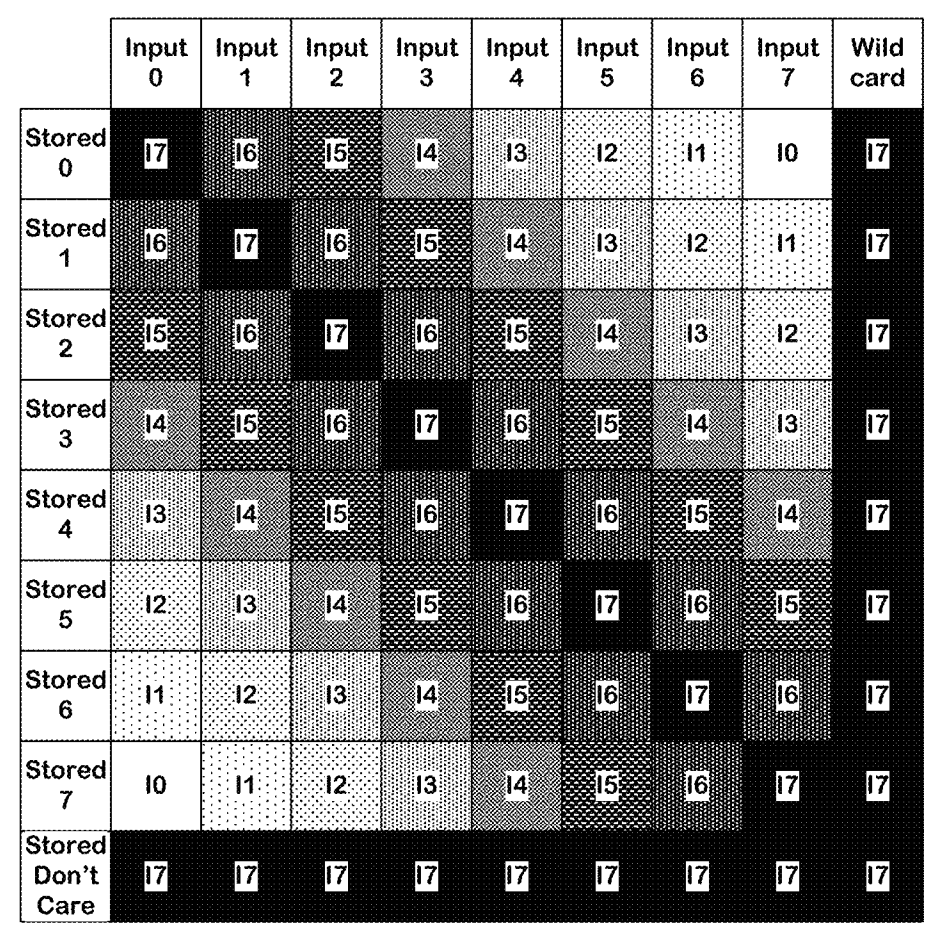
Figures 11A, 11B:
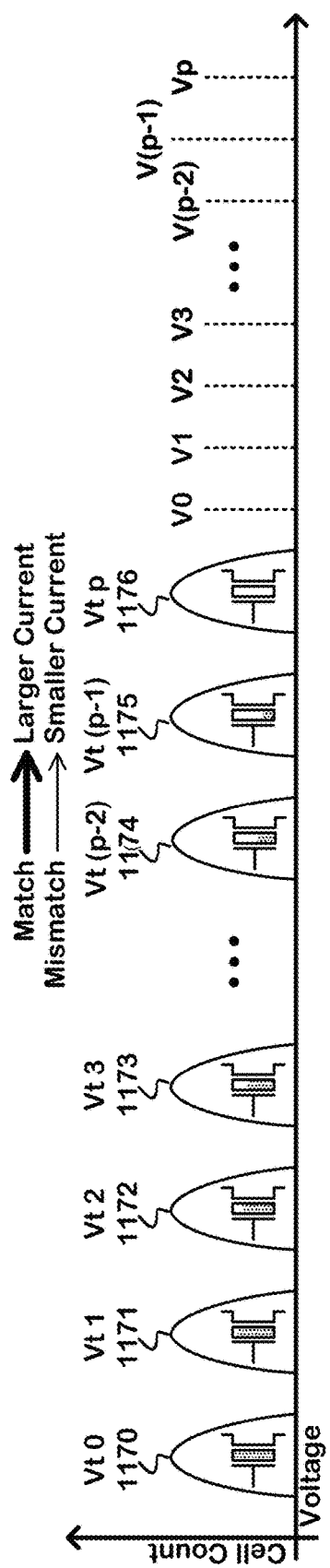
FIGS. 11A and 11B collectively illustrate an example of a p-level encoding technique using p threshold levels and providing a smaller current indication for mismatches between search data and stored data.

For example, FIGS. 5A and 5B as well as FIGS. 9A and 9B illustrate a two-level technique. For another example, FIGS. 6A, 6B, and 6C as well as FIGS. 10A, 10B, and 10C illustrate an eight-level technique. For another example, FIGS. 7A and 7B as well as FIGS. 11A and 11B illustrate a p-level technique. For another example, FIG. 8 illustrates an analog technique.

Each of the two-level, eight-level, p-level, and analog techniques is in accordance with a respective particular encoding as implemented by Data Encoder 160 and Search Encoder 170 of FIG. 1.

3D Memory Search Large Mismatch Current

FIGS. 5A and 5B illustrate an example of an encoding technique using two threshold levels and providing a large current indication of a mismatch between search data and stored data. The encoding technique is referred to as a two-threshold large-current-mismatch encoding technique. The figures correspond to a two-threshold large-current-mismatch implementation of IMS Cell 480 of FIG. 4.

FIG. 5A illustrates the two threshold levels, Memory State LVT 572 and Memory State HVT 573. The figure also illustrates a representation of a mismatch between search input and stored data as resulting in a large current through at least one of Floating Gate device (FG) 483 and Floating Gate device prime (FG') 484 (of FIG. 4), and a representation of a match between search input and stored data as resulting in a small current through each of Floating Gate device (FG) 483 and Floating Gate device prime (FG') 484.

FIG. 5B illustrates search data encoding and stored data encoding according to the two-threshold large-current-mismatch encoding technique.

Figures 6A, 6B:
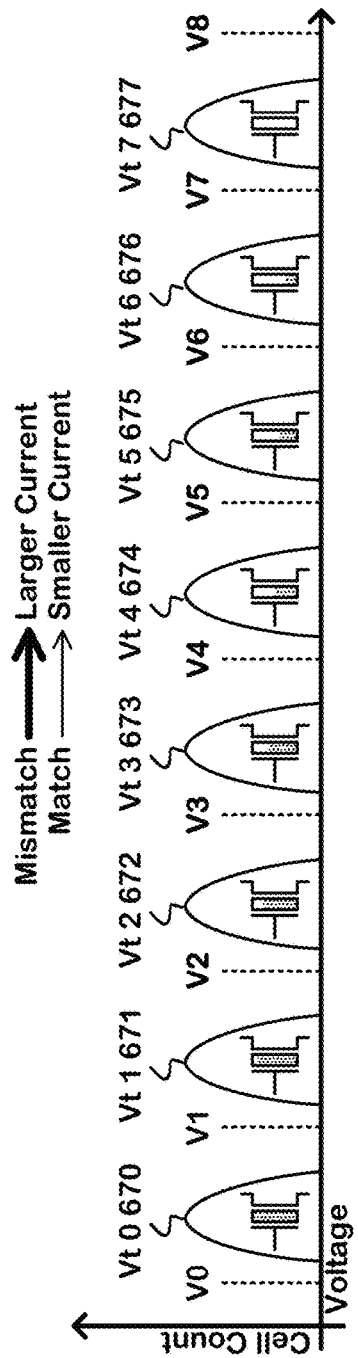

FIGS. 6A, 6B, and 6C collectively illustrate an example of an encoding technique using eight threshold levels and providing a larger current indication for mismatches between search data and stored data. The encoding is referred to as an eight-threshold larger-current-mismatch encoding technique. The figures correspond to an eight-threshold larger-current-mismatch implementation of IMS Cell 480 of FIG. 4.

FIG. 6A illustrates the eight threshold levels as Vt 1 671 . . . Vt 7 677 and a zero threshold level as Vt 0 670 as well as corresponding encoding voltages as V0 . . . V8. The figure also illustrates a representation of a mismatch between search input and stored data as resulting in a relatively larger current through at least one of Floating Gate device (FG) 483 and Floating Gate device prime (FG') 484 (of FIG. 4), and a representation of a match between search input and stored data as resulting in a relatively smaller current through each of Floating Gate device (FG) 483 and Floating Gate device prime (FG') 484.

FIG. 6B illustrates search data encoding and stored data encoding according to the eight-threshold larger-current-mismatch encoding technique.

FIG. 6C illustrates examples of total current through Floating Gate device (FG) 483 and Floating Gate device prime (FG') 484 together in various combinations of search input and stored data. Generally darker boxes indicate smaller currents. For example, matches between search input and stored data along the descending diagonal result in the smallest total current, Ioff.

Figures 7A, 7B:
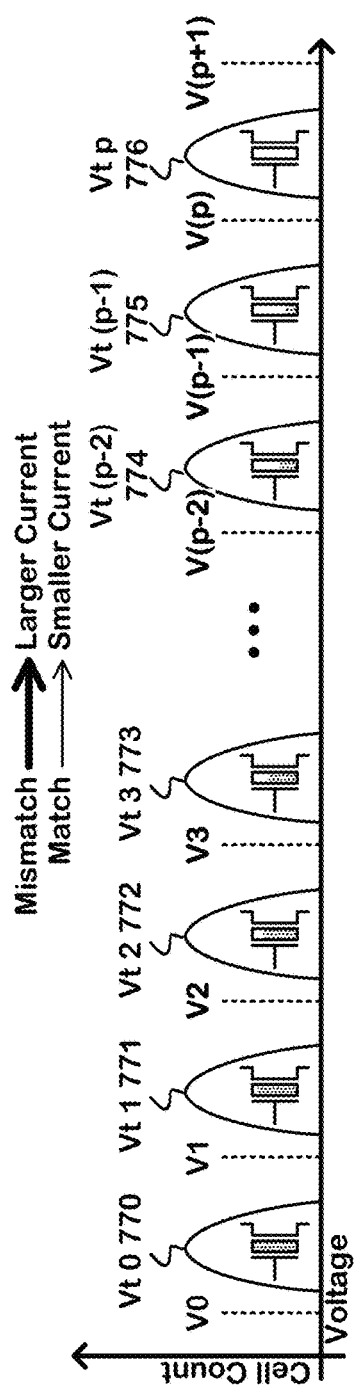
FIGS. 7A and 7B collectively illustrate an example of a p-level encoding technique using p threshold levels and providing a larger current indication for mismatches between search data and stored data.

FIGS. 7A and 7B collectively illustrate an example of a p-level encoding technique using p threshold levels and providing a larger current indication for mismatches between search data and stored data. The encoding is referred to as a p-threshold larger-current-mismatch encoding technique. The figures correspond to a p-threshold larger-current-mismatch implementation of IMS Cell 480 of FIG. 4. Correspondingly, the figures correspond to a p-level generalization of the 8-level technique of FIGS. 6A, 6B, and 6C.

FIG. 7A illustrates the p threshold levels as Vt 1 771 . . . . Vt p 776 and a zero-threshold level as Vt 0 770 as well as corresponding encoding voltages as V0, V1 . . . V(p−2), v(p−1), V(p), and V(p+1). The figure also illustrates a representation of a mismatch between search input and stored data as resulting in a relatively larger current through at least one of Floating Gate device (FG) 483 and Floating Gate device prime (FG') 484 (of FIG. 4), and a representation of a match between search input and stored data as resulting in a relatively smaller current through each of Floating Gate device (FG) 483 and Floating Gate device prime (FG') 484.

FIG. 7B illustrates search data encoding and stored data encoding according to the p-threshold larger-current-mismatch encoding technique.

FIG. 8 illustrates an example of an encoding technique using analog levels and providing a larger current indication for mismatches between search data and stored data. The encoding is referred to as an analog larger-current-mismatch encoding technique. The figure corresponds to an analog larger-current-mismatch implementation of IMS Cell 480 of FIG. 4.

Current 810 represents a vertical dimension for memory device source-drain current plotted against a horizontal dimension for memory device control gate voltage. Two plots are illustrated, Current 883 for the source-drain current of Floating Gate device (FG) 483 of FIG. 4, and Current' 884 for Floating Gate device prime (FG') 484 of FIG. 4. With respect to Floating Gate device (FG) 483, Current 883 is the source-drain current as a function of voltage applied to Word Line (WL) 481 as illustrated by Word Line (WL) 881 over a range (e.g., 4 to 0 volts). Similarly, with respect to Floating Gate device prime (FG') 484, Current' 884 is the source-drain current as a function of voltage applied to Word Line prime (WL') 482 as illustrated by Word Line prime (WL') 882 over a range (e.g., 0 to 4 volts).

There are two zones of word line voltages that indicate mismatch between search input and stored data (stored data as indicated by tuned threshold voltage). The first of the two zones, Mismatch 885, indicates Floating Gate device (FG) 483 is on, enabling a larger current. The second of the two zones, Mismatch 887, indicates Floating Gate device prime (FG') 484 is on, enabling a larger current. A single middle zone indicates a match between search input and stored data. The middle zone, Match 886, indicates when both Floating Gate device (FG) 483 and Floating Gate device prime (FG') 484 are off, resulting in a smaller current.

Thus, WL, WL' 888 represents a combination of voltages on Word Line (WL) 481 and Word Line prime (WL') 482 resulting in smaller current from IMS Cell 480, indicating a match between search input and stored data. WL, WL' 889 represents a combination of voltages on Word Line (WL) 481 and Word Line prime (WL') 482 resulting in larger current from IMS Cell 480, indicating a mismatch between search input and stored data.

Floating Gate device (FG) 483 is illustrated as having a tunable threshold voltage over a range indicated by Tunable Vt 878. Similarly, Floating Gate device prime (FG') 484 is illustrated as having a tunable threshold voltage over a range indicated by Tunable Vt 879. The tunable threshold voltages enable adjusting widths of Mismatch 885, Match 886, and Mismatch 887.

3D Memory Search Small Mismatch Current

FIGS. 9A and 9B illustrate an example of an encoding technique using two threshold levels and providing a small current as an indication of a mismatch between search data and stored data. The encoding technique is referred to as a two-threshold small-current-mismatch encoding technique. The figures correspond to a two-threshold small-current-mismatch implementation of IMS Cell 480 of FIG. 4.

FIG. 9A illustrates the two threshold levels, Memory State LVT 972 and Memory State HVT 973. The figure also illustrates a representation of a mismatch between search input and stored data as resulting in a small current through each of Floating Gate device (FG) 483 and Floating Gate device prime (FG') 484 (of FIG. 4), and a representation of a match between search input and stored data as resulting in a large current through at least one of Floating Gate device (FG) 483 and Floating Gate device prime (FG') 484.

FIG. 9B illustrates search data encoding and stored data encoding according to the two-threshold small-current-mismatch encoding technique.

FIGS. 10A, 10B, and 10C collectively illustrate an example of an encoding technique using eight threshold levels and providing a smaller current indication for mismatches between search data and stored data. The encoding is referred to as an eight-threshold smaller-current-mismatch encoding technique. The figures correspond to an eight-threshold smaller-current-mismatch implementation of IMS Cell 480 of FIG. 4.

FIG. 10A illustrates the eight threshold levels as Vt 0 1070 . . . Vt 7 1077 as well as corresponding encoding voltages V0 . . . V7. The figure also illustrates a representation of a mismatch between search input and stored data as resulting in a relatively smaller current through each of Floating Gate device (FG) 483 and Floating Gate device prime (FG') 484 (of FIG. 4), and a representation of a match between search input and stored data as resulting in a relatively larger current through at least one of Floating Gate device (FG) 483 and Floating Gate device prime (FG') 484.

FIG. 10B illustrates search data encoding and stored data encoding according to the eight-threshold smaller-current-mismatch encoding technique.

FIG. 10C illustrates examples of total current through Floating Gate device (FG) 483 and Floating Gate device prime (FG') 484 together in various combinations of search input and stored data. Generally darker boxes indicate larger currents For example, matches between search input and stored data along the descending diagonal result in the largest total current, 17.

FIGS. 11A and 11B collectively illustrate an example of a p-level encoding technique using p threshold levels and providing a smaller current indication for mismatches between search data and stored data. The encoding is referred to as a p-threshold smaller-current-mismatch encoding technique. The figures correspond to a p-threshold smaller-current-mismatch implementation of IMS Cell 480 of FIG. 4. Correspondingly, the figures correspond to a p-level generalization of the 8-level technique of FIGS. 10A, 10B, and 10C.

FIG. 11A illustrates the p threshold levels as illustrated as Vt 1 1171 . . . Vt p 1176 and a zero threshold level as Vt 0 1170 as well as corresponding encoding voltages as Vt 0 . . . Vt p. The figure also illustrates a representation of a mismatch between search input and stored data as resulting in a relatively smaller current through each of Floating Gate device (FG) 483 and Floating Gate device prime (FG') 484 (of FIG. 4), and a representation of a match between search input and stored data as resulting in a relatively larger current through at least one of Floating Gate device (FG) 483 and Floating Gate device prime (FG') 484.

FIG. 11B illustrates search data encoding and stored data encoding according to the p-threshold smaller-current-mismatch encoding technique.

3D Memory Search Multiple Layers

Figures 12A, 12B:
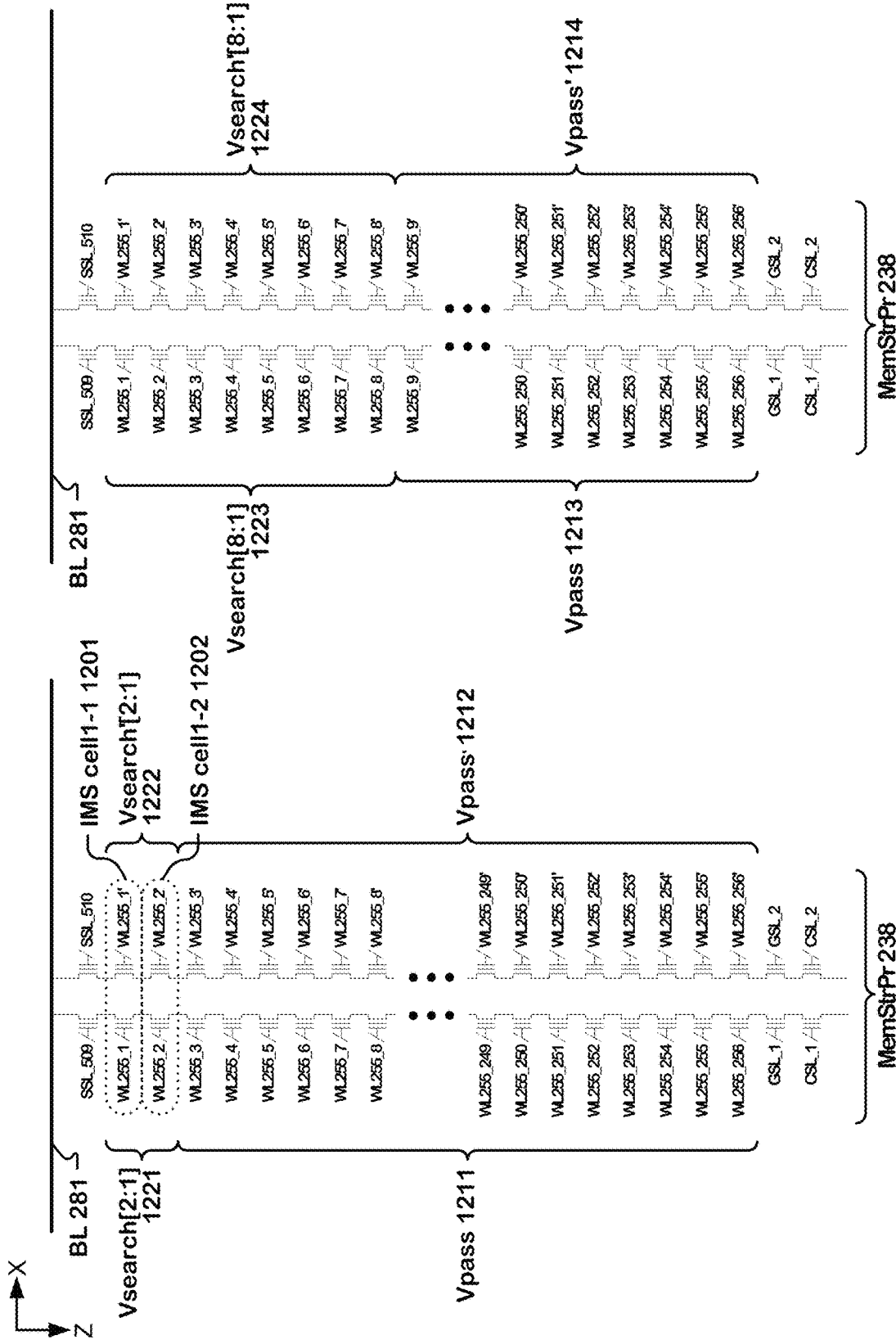
FIGS. 12A, 12B, and 12C illustrate multi-layer searching operations.
Figure 12C:
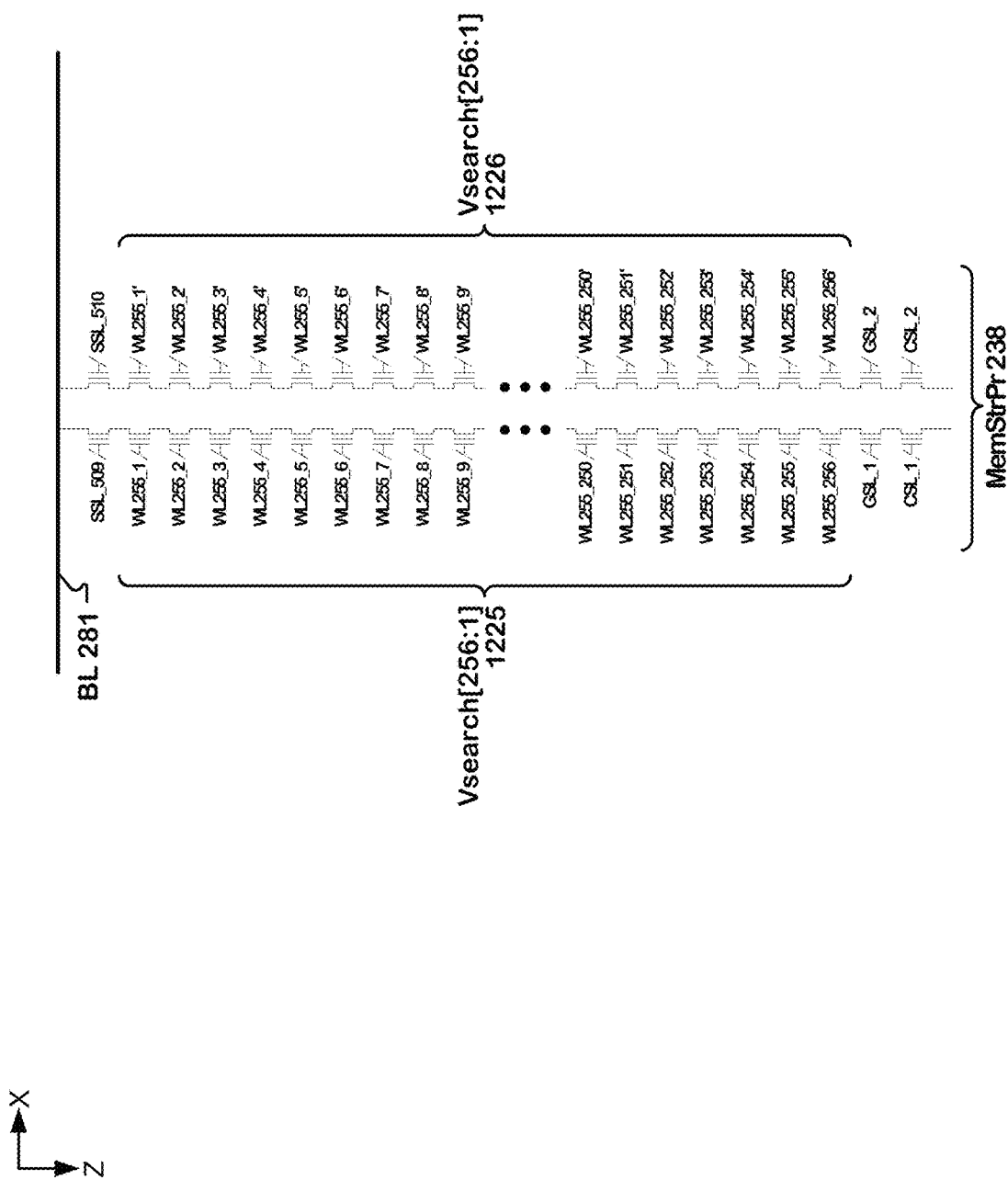

FIGS. 12A, 12B, and 12C illustrate multi-layer searching operations, such as performed using Memory String Pair (MemStrPr) 238 connected to Bit Line (BL) 281 of FIG. 2.

FIG. 12A illustrates Memory String Pair (MemStrPr) 238 and Bit Line (BL) 281 being used to perform a two-layer search. Data to search for is encoded according to a particular encoding technique and stored in IMS cell1-1 1201 and IMS cell1-2 1202. Search criteria includes a search depth indicating two layers and a search start indicating the first layer. The search criteria also includes a search value that is encoded according to the particular encoding (e.g., by Search Encoder 170 of FIG. 1). The encoded search value is applied to Memory String Pair (MemStrPr) 238 via two word lines respectively for each of the left-hand and right-hand memory strings. The encoded search value applied to the left-hand memory string word lines is illustrated as Vsearch[2:1] 1221. The encoded search value applied to the right-hand memory string word lines is illustrated as Vsearch'[2:1] 1222. The remainder of the word lines are driven with a voltage that enables passing current through the left-hand and right-hand memory strings. The enabling voltage is indicated by Vpass 1211 and Vpass' 1212 in the figure.

FIG. 12B illustrates Memory String Pair (MemStrPr) 238 and Bit Line (BL) 281 being used to perform an eight-layer search. Data to search for is encoded according to a particular encoding technique and stored in the memory devices affected by Vsearch[8:1] 1223 and Vsearch'[8:1] 1224. Search criteria includes a search depth indicating eight layers and a search start indicating the first layer. The search criteria also includes a search value that is encoded according to the particular encoding (e.g., by Search Encoder 170 of FIG. 1). The encoded search value is applied to Memory String Pair (MemStrPr) 238 via eight word lines respectively for each of the left-hand and right-hand memory strings. The encoded search value applied to the left-hand memory string word lines is illustrated as Vsearch[8:1] 1223. The encoded search value applied to the right-hand memory string word lines is illustrated as Vsearch'[8:1] 1224. The remainder of the word lines are driven with a voltage that enables passing current through the left-hand and right-hand memory strings. The enabling voltage is indicated by Vpass 1213 and Vpass' 1214 in the figure.

FIG. 12C illustrates Memory String Pair (MemStrPr) 238 and Bit Line (BL) 281 being used to perform an all-layer (e.g., 256-layer) search. Data to search for is encoded according to a particular encoding technique and stored in all the memory devices of Memory String Pair (MemStrPr) 238. Search criteria includes a search depth indicating 256 layers and a search start indicating the first layer. The search criteria also includes a search value that is encoded according to the particular encoding (e.g., by Search Encoder 170 of FIG. 1). The encoded search value is applied to Memory String Pair (MemStrPr) 238 via 256 word lines respectively for each of the left-hand and right-hand memory strings. The encoded search value applied to the left-hand memory string word lines is illustrated as Vsearch [256:1] 1225. The encoded search value applied to the right-hand memory string word lines is illustrated as Vsearch' [256:1] 1226.

Search depth variously indicates any number of layers from one to the total number of layers (e.g., 1, 2, 3, 4, 96, 192, 232, 256, and so forth). Search start variously indicates any number from the first layer to the last layer.

3D Memory Search Two Layers/Large Mismatch Current

Figure 13A:
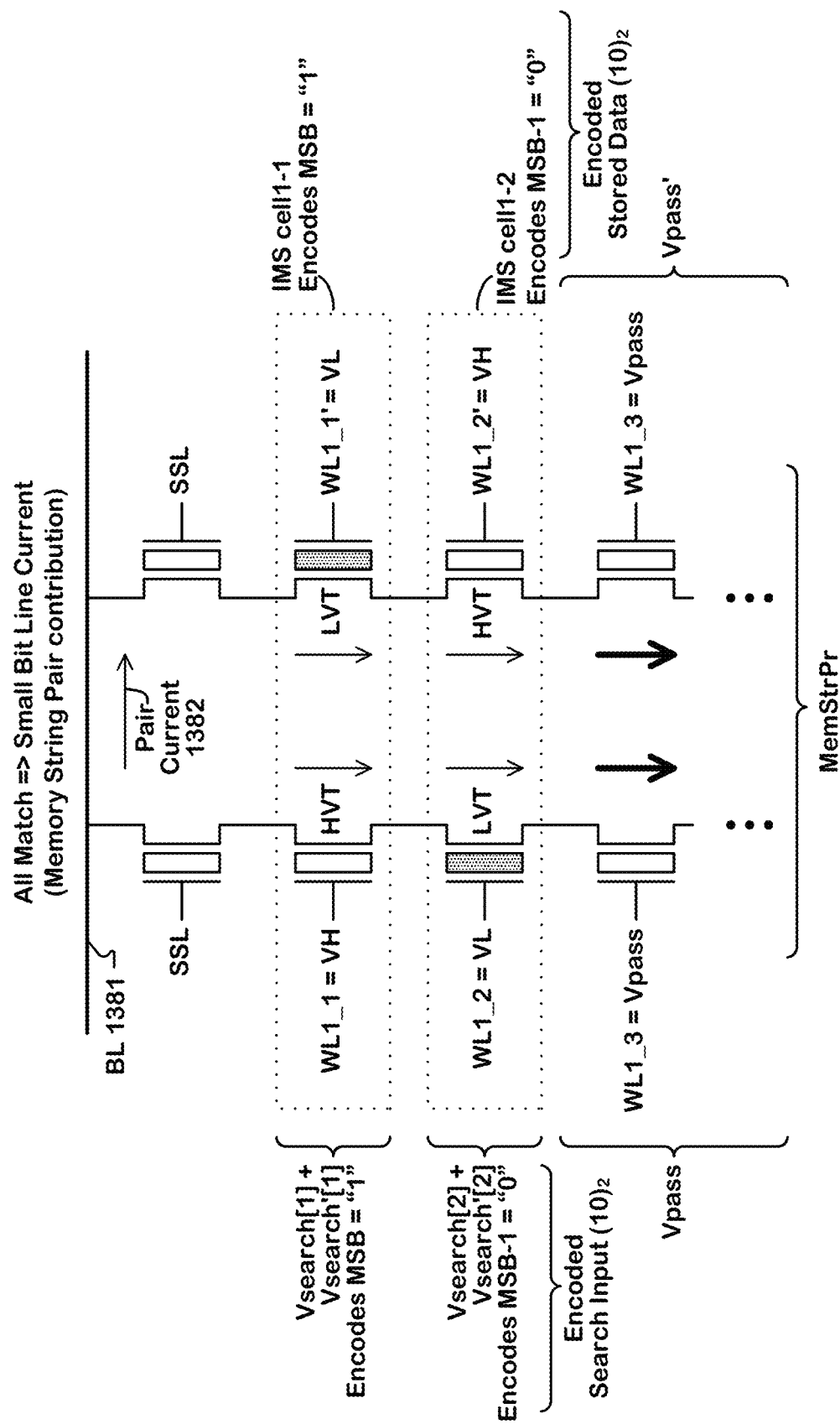
FIGS. 13A, 13B, and 13C illustrate various two-layer searching operations according to the two-threshold large-current-mismatch encoding technique.
Figure 13B:
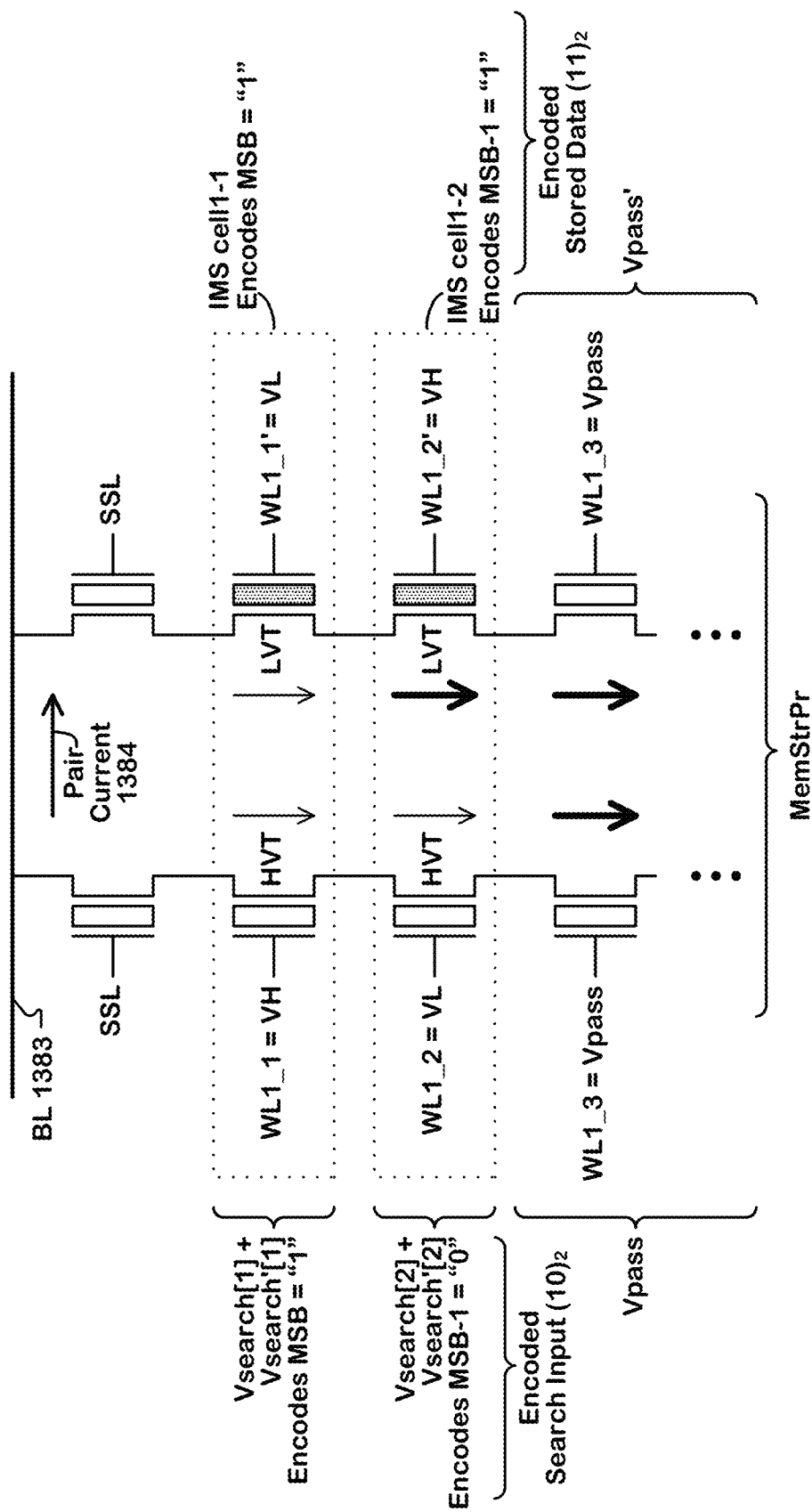
Figure 13C:
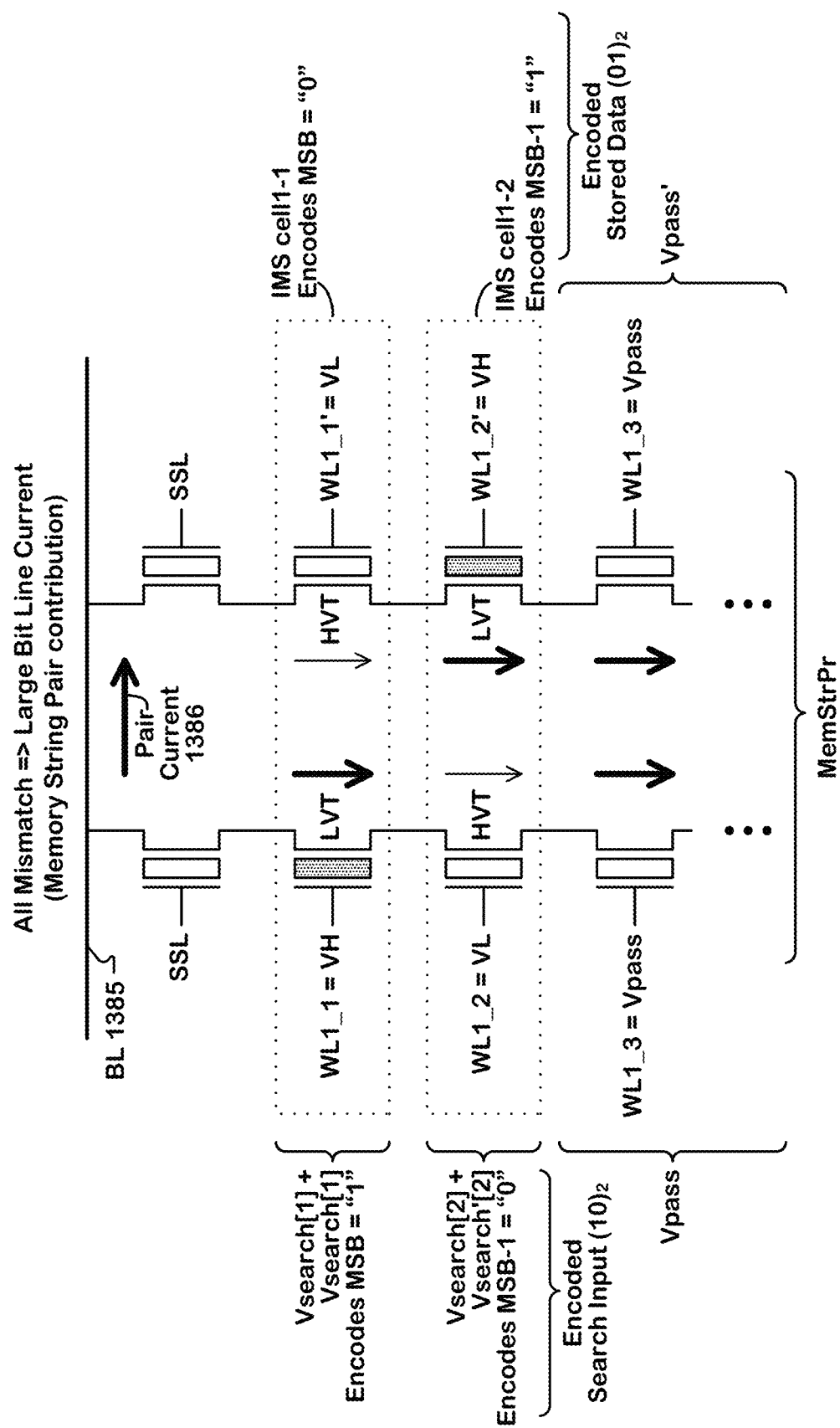

FIGS. 13A, 13B, and 13C illustrate various two-layer searching operations according to the two-threshold large-current-mismatch encoding technique. Each of the figures illustrates searching for "10" in base 2 (binary), with a "1" in the most-significant bit of the search data and a "0" in the next-most-significant bit of the search data. The figures differ in the stored values.

FIG. 13A illustrates operation with a stored value of "10" and thus results in a full match with the search value of "10". Responsive to the match, Pair Current 1382 is small, thus contributing a small current to Bit Line (BL) 1381.

FIG. 13B illustrates operation with a stored value of "11" and thus results in a partial match with the search value of "10"—the most-significant bits match and the next-most-significant bits mismatch. Responsive to the partial match, Pair Current 1384 is a middle value, in between a small value and a large value, thus contributing a middle amount of current to Bit Line (BL) 1383.

FIG. 13C illustrates operation with a stored value of "01" and thus results in an all mismatch with the search value of "10". Responsive to the all mismatch, Pair Current 1386 is a large value, thus contributing a large value of current to Bit Line (BL) 1385.

3D Memory Search Two Layers/Small Mismatch Current

Figure 14A:
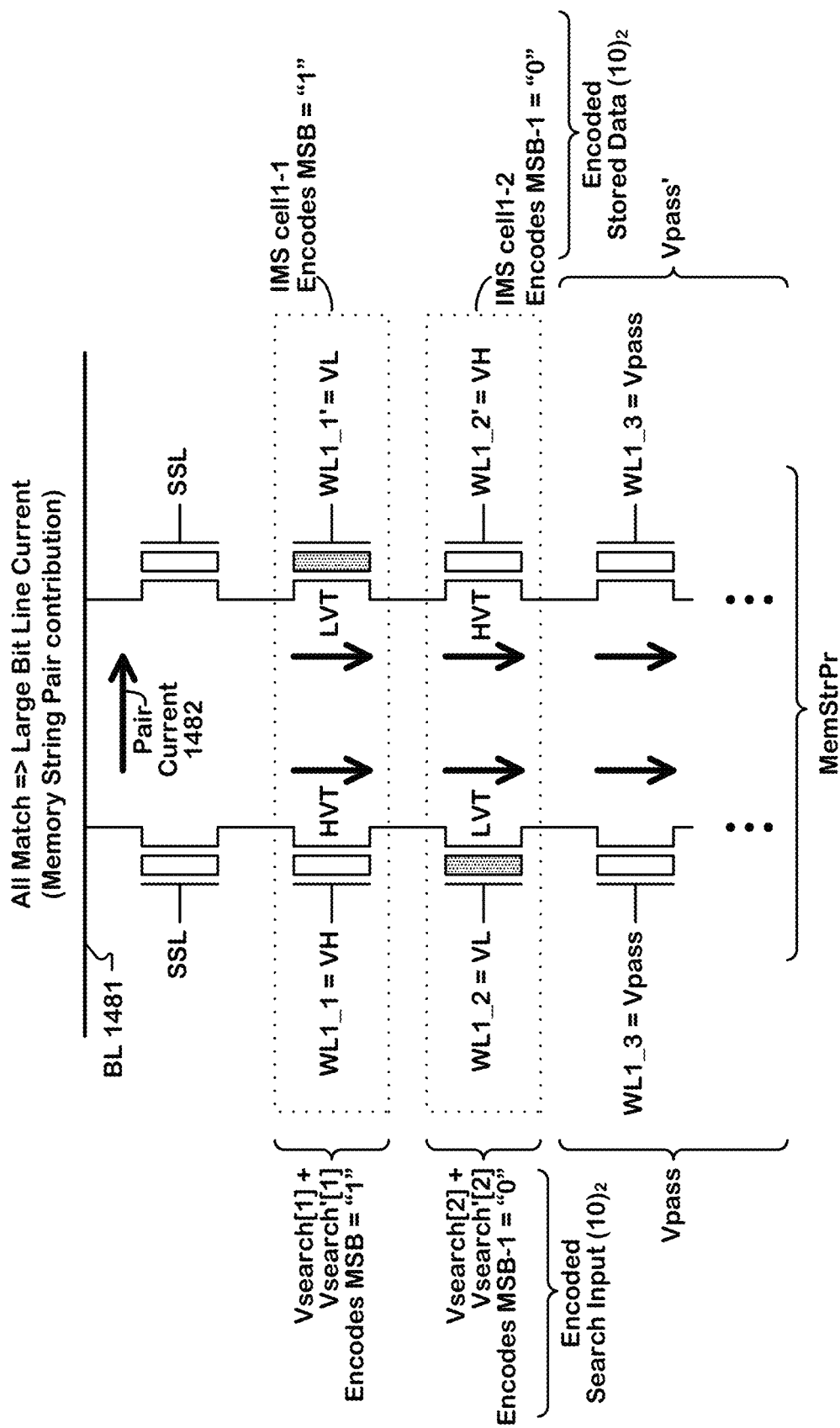
FIGS. 14A, 14B, and 14C illustrate various two-layer searching operations according to the two-threshold small-current-mismatch encoding technique.
Figure 14B:
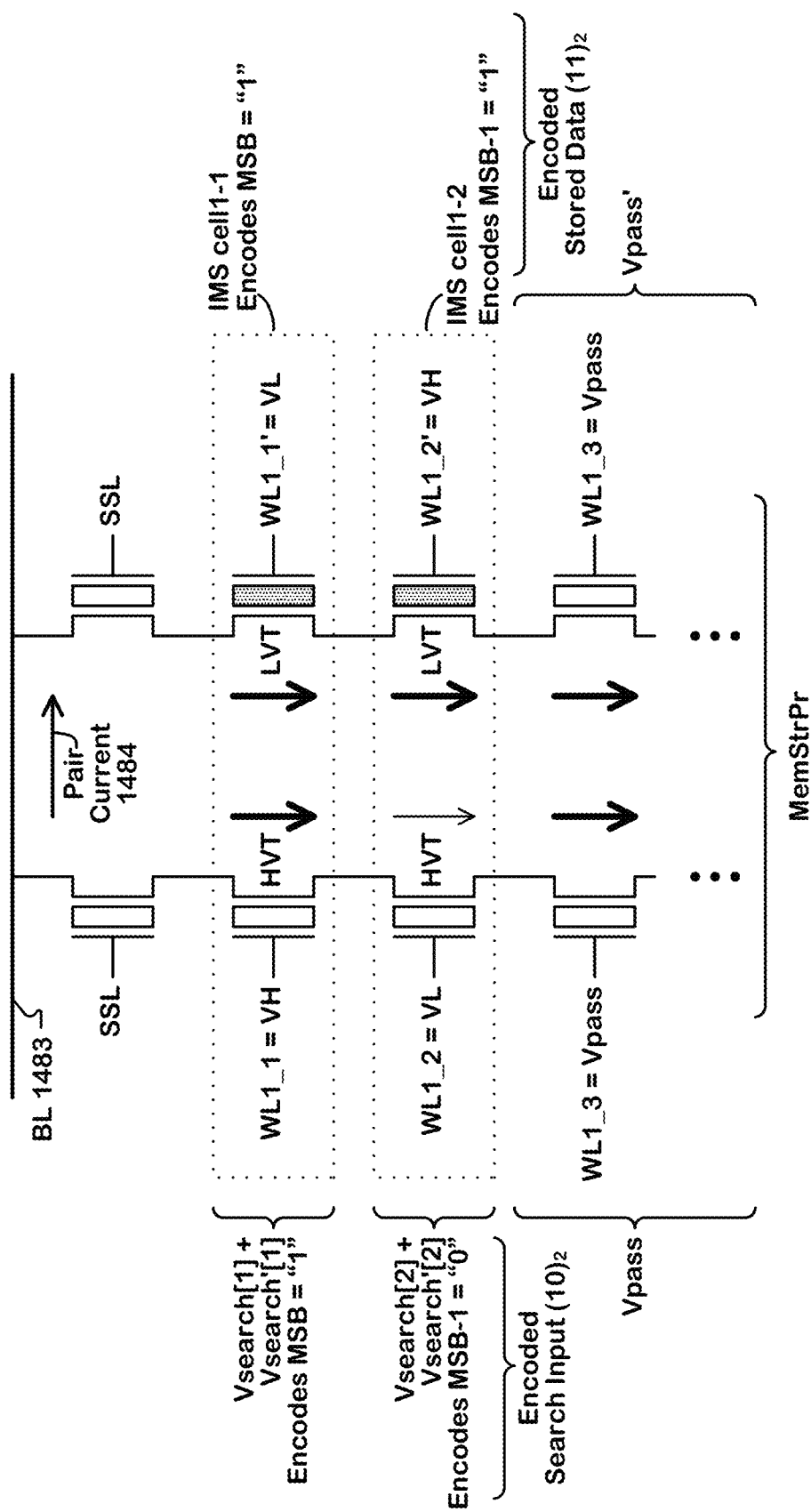
Figure 14C:
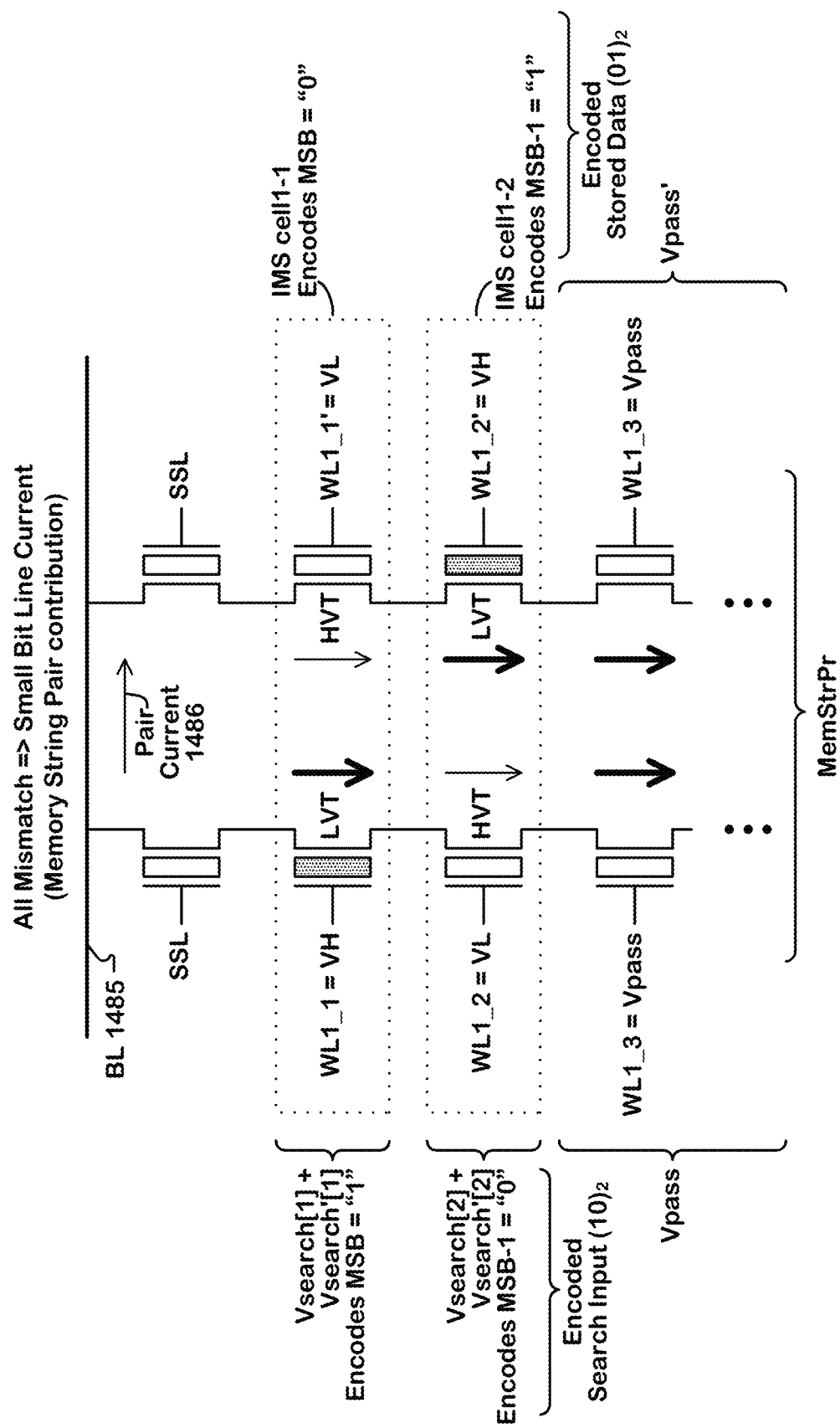

FIGS. 14A, 14B, and 14C illustrate various two-layer searching operations according to the two-threshold small-current-mismatch encoding technique. As in FIGS. 13A, 13B, and 13C, each of the figures illustrates searching for "10" in base 2 (binary), and the figures differ in the stored values.

FIG. 14A illustrates operation with a stored value of "10" and thus results in a full match with the search value of "10". Responsive to the match, Pair Current 1482 is large, thus contributing a large current to Bit Line (BL) 1481.

FIG. 14B illustrates operation with a stored value of "11" and thus results in a partial match with the search value of "10"—the most-significant bits match and the next-most-significant bits mismatch. Responsive to the partial match, Pair Current 1484 is a middle value, in between a small value and a large value, thus contributing a middle amount of current to Bit Line (BL) 1483.

FIG. 14C illustrates operation with a stored value of "01" and thus results in an all mismatch with the search value of "10". Responsive to the all mismatch, Pair Current 1486 is a small value, thus contributing a small value of current to Bit Line (BL) 1485.

Figure 15A:
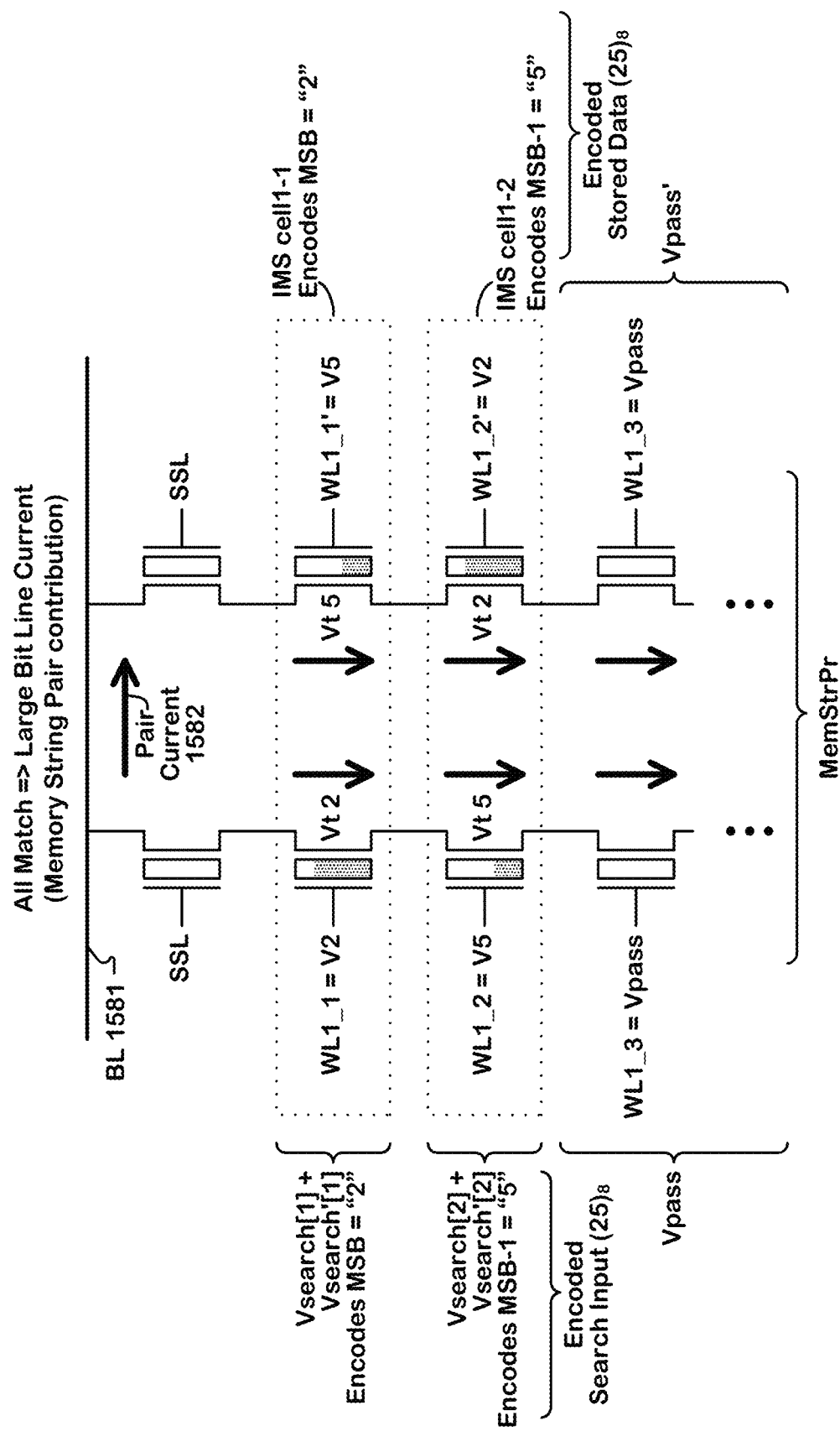
FIGS. 15A, 15B, and 15C illustrate various two-layer searching operations according to the eight-threshold small-current-mismatch encoding technique.
Figure 15B:
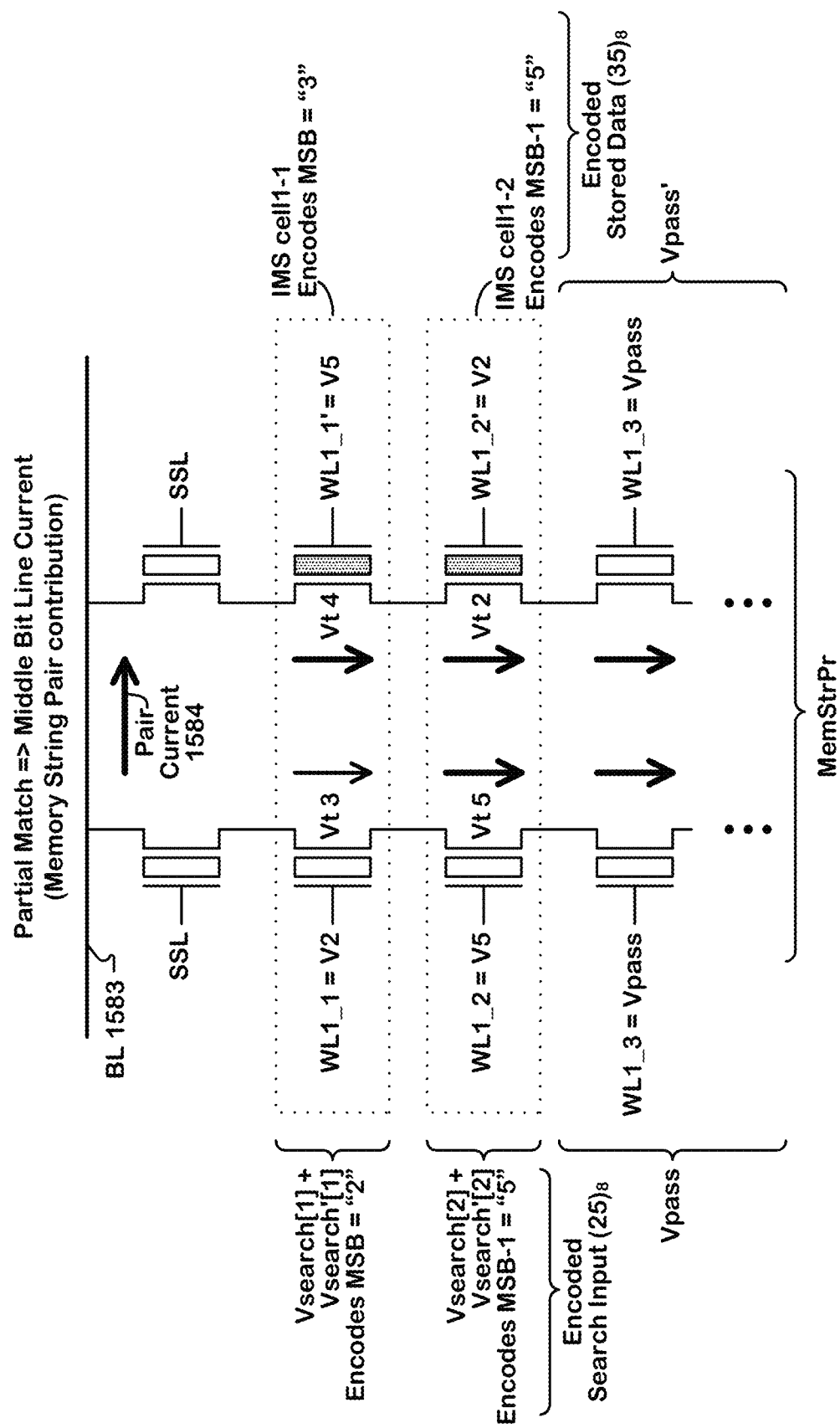
Figure 15C:
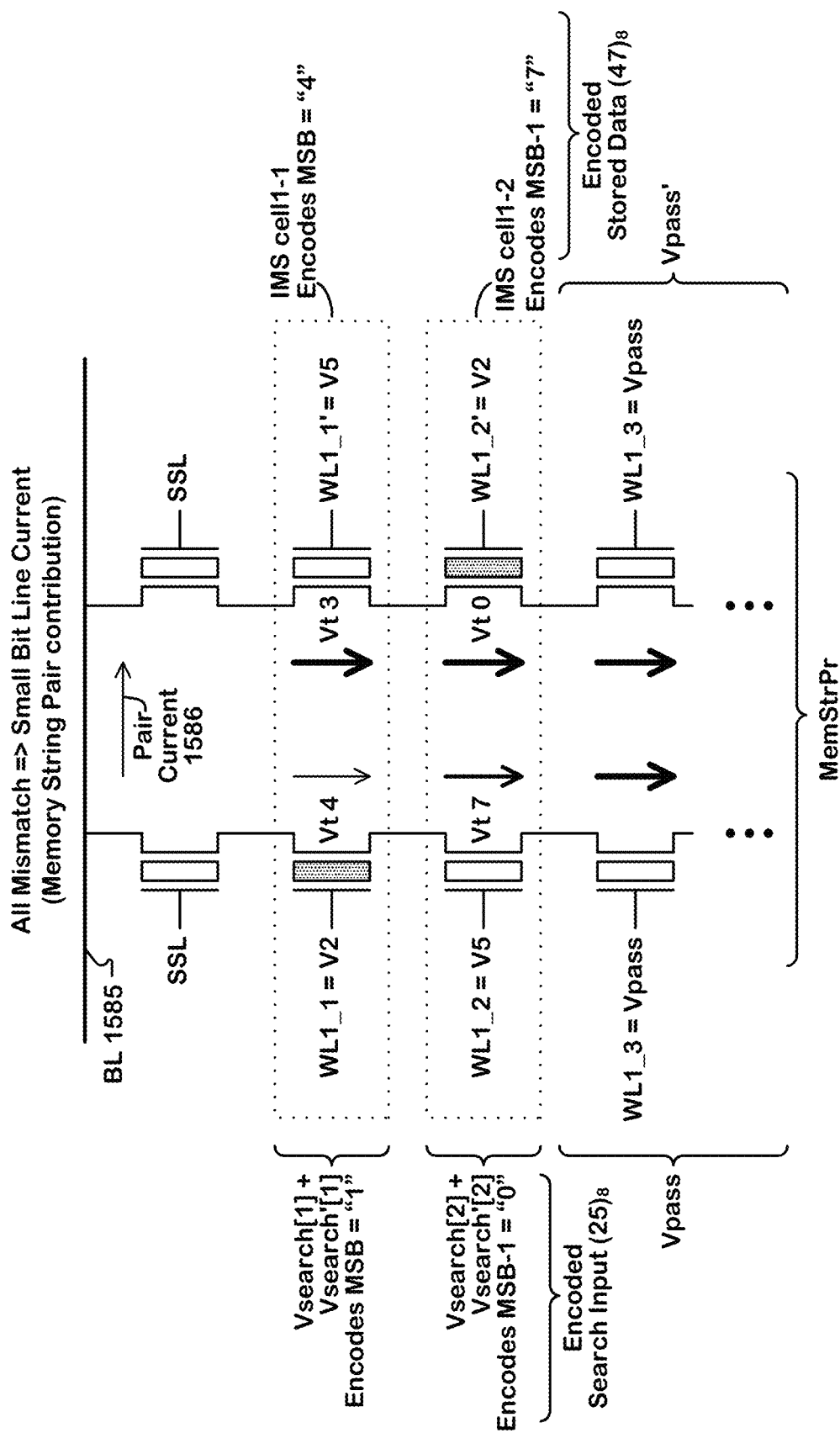

FIGS. 15A, 15B, and 15C illustrate various two-layer searching operations according to the eight-threshold small-current-mismatch encoding technique. Each of the figures illustrates searching for "25" in base 8 (octal), with a "2" in the most-significant digit of the search data and a "5" in the next-most-significant digit of the searched data. The figures differ in the stored values.

FIG. 15A illustrates operation with a stored value of "25" in base 8, and thus results in a full match with the search value of "25" in base 8. Responsive to the match, Pair Current 1582 is large, thus contributing a large current to Bit Line (BL) 1581.

FIG. 15B illustrates operation with a stored value of "25" in base 8 and thus results in a partial match with the search value of "35" in base 8—the most-significant digits match and the next-most-significant digits mismatch. Responsive to the partial match, Pair Current 1584 is a middle value, in between a small value and a large value, thus contributing a middle amount of current to Bit Line (BL) 1583.

FIG. 15C illustrates operation with a stored value of "25" in base 8 and thus results in an all mismatch with the search value of "47" in base 8. Responsive to the all mismatch, Pair Current 1586 is a small value, thus contributing a small value of current to Bit Line (BL) 1585.

Figure 15D:
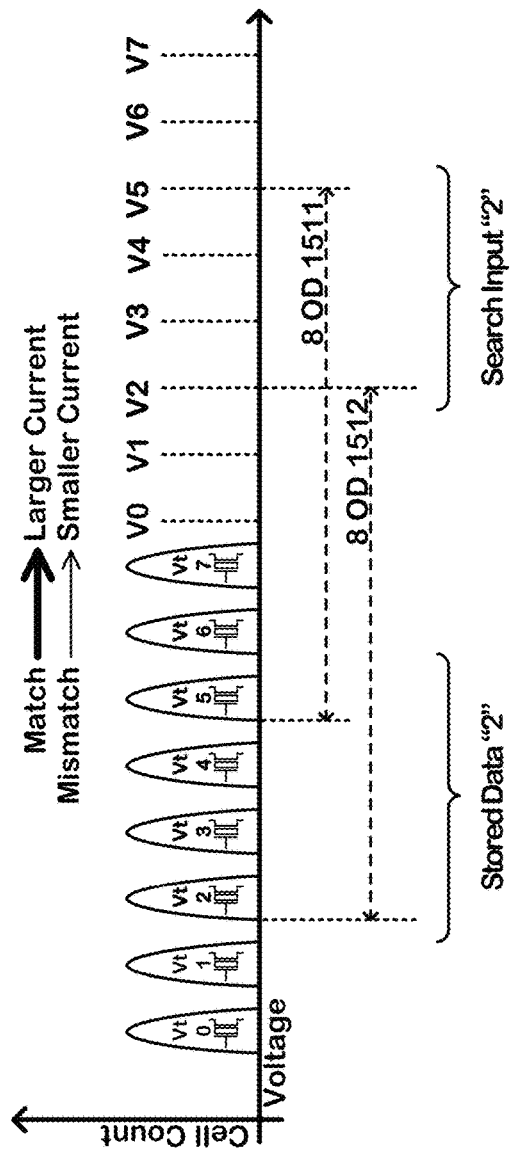
FIGS. 15D and 15E respectively illustrate a match example and a mismatch example according to the eight-threshold small-current-mismatch encoding technique.
Figure 15E:
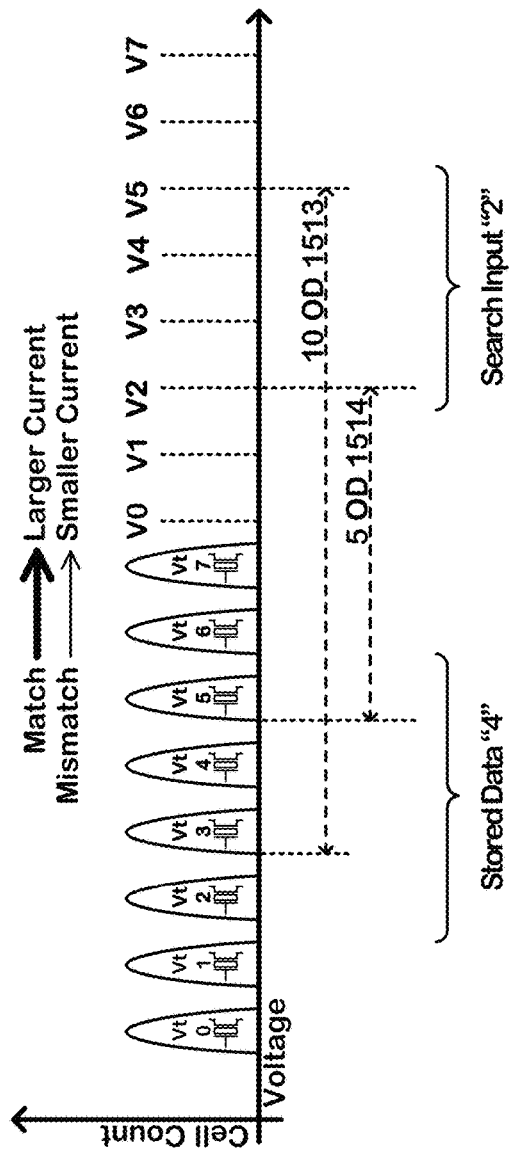

FIGS. 15D and 15E respectively illustrate a match example and a mismatch example according to the eight-threshold small-current-mismatch encoding technique.

FIG. 15D illustrates the match example. A first memory device from a left-hand memory string of a memory string pair and a second memory device from a right-hand memory string of the memory string pair are collectively programmed to store "2" in base 8. In response to a matching search input of "2" in base 8, an "eight times" overdrive results for each of the first and the second memory devices. Vt 5 and V5 are respectively the programmed threshold of the first memory device and the word line voltage applied to the control gate of the first memory device. Vt 2 and V2 are respectively the programmed threshold of the second memory device and the word line voltage applied to the control gate of the second memory device. The overdrives are conceptually illustrated as 8 OverDrive (OD) 1511 and 8 OverDrive (OD) 1512 in the figure.

FIG. 15E illustrates the mismatch example. A first memory device from a left-hand memory string of a memory string pair and a second memory device from a right-hand memory string of the memory string pair are collectively programmed to store "4" in base 8. In response to a mismatching search input of "2" in base 8, a "ten times" overdrive results for the first memory device and a "five times" overdrive results for the second memory device. Vt 3 and V5 are respectively the programmed threshold of the first memory device and the word line voltage applied to the control gate of the first memory device. Vt 5 and V2 are respectively the programmed threshold of the second memory device and the word line voltage applied to the control gate of the second memory device. The overdrives are conceptually illustrated as 10 OverDrive (OD) 1513 and 5 OverDrive (OD) 1514 in the figure.

In an example implementation of the memory devices, currents for "eight times" overdrive through "ten times" overdrive are nearly identical, as the memory devices are operating in the saturation region. Thus, current is dominated by low overdrive from either of the two memory devices.

3D Memory Search Multiple Layers/Multiple String Search Lines

Figure 16A:
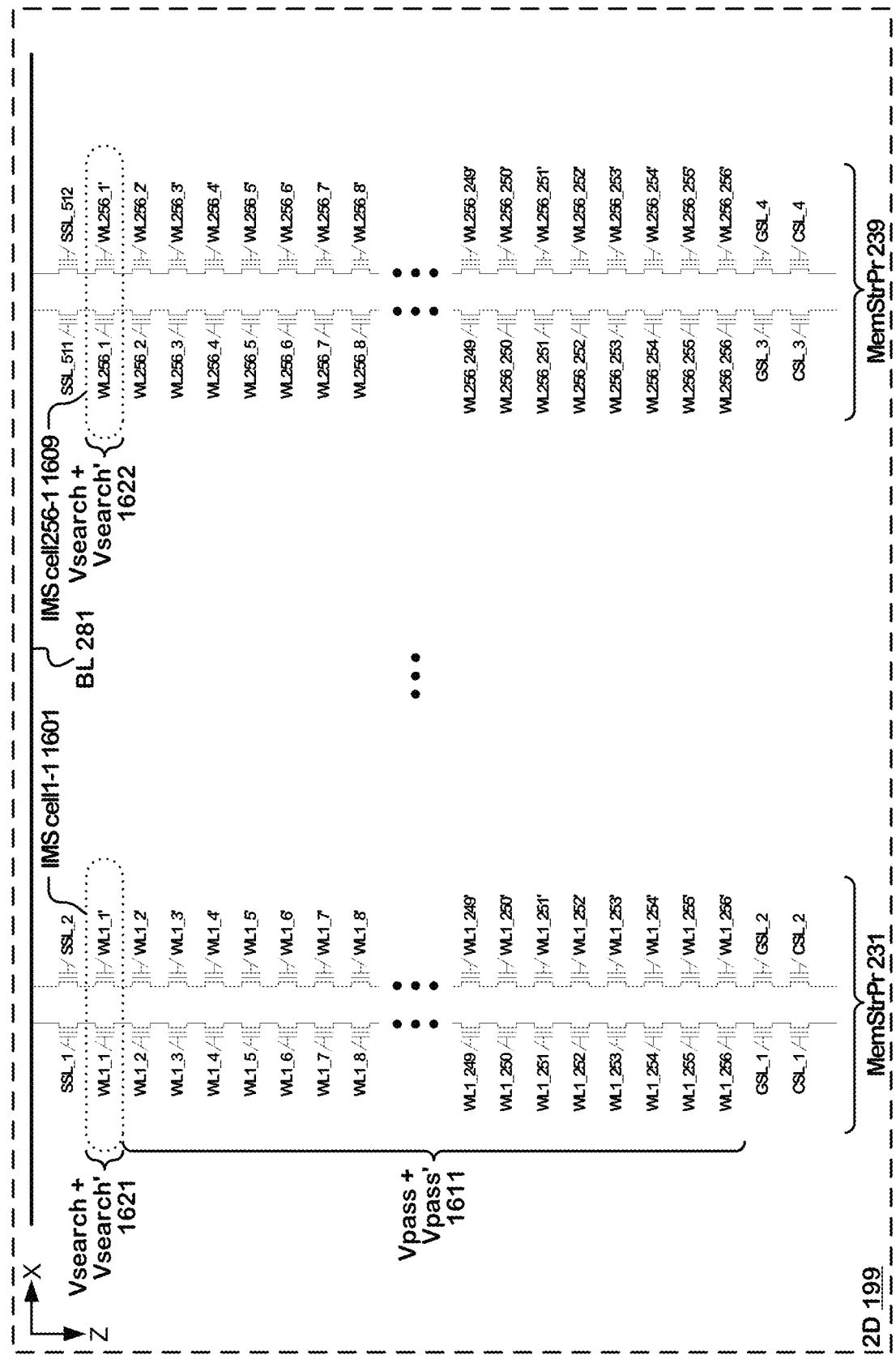
FIGS. 16A, 16B, and 16C illustrate various searching operations according to any of the large-current-mismatch encoding techniques.
Figure 16B:
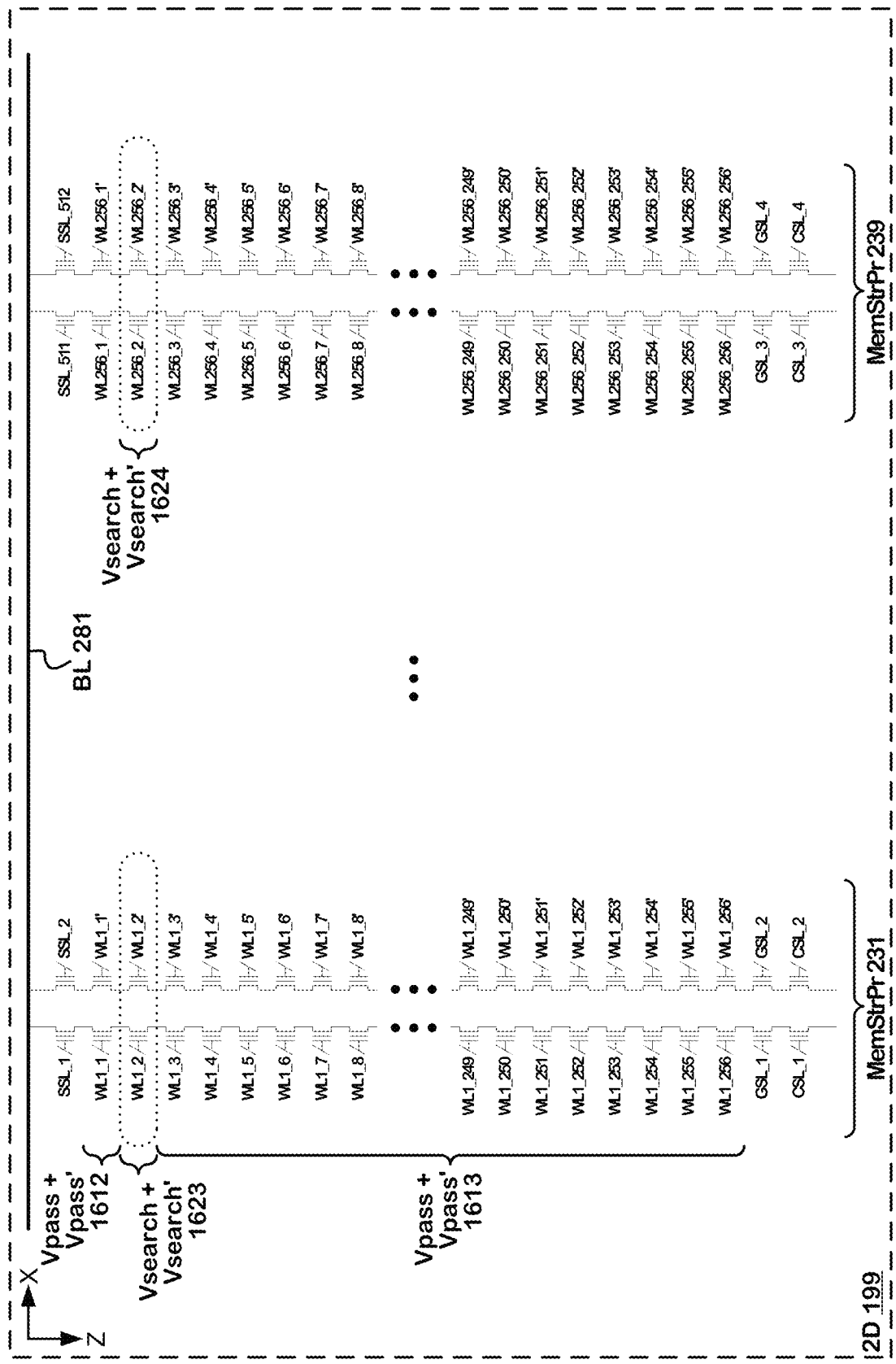
Figure 16C:
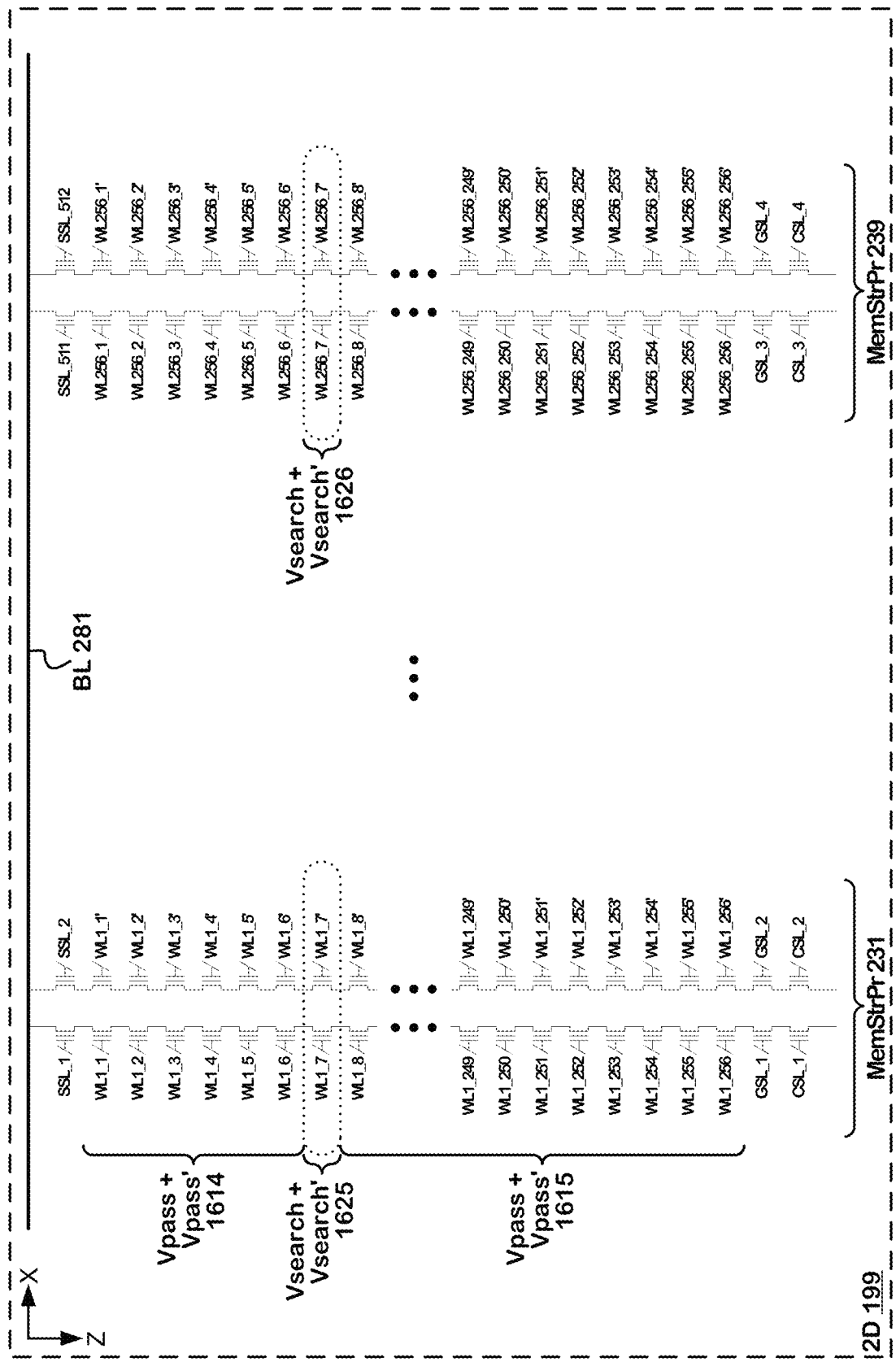

FIGS. 16A, 16B, and 16C illustrate various searching operations according to any of the large-current-mismatch encoding techniques. Each of the figures illustrates searching with a search depth of one (search one layer). The figures differ according to search start (which layer to begin searching). The figures are in the context of 2D Memory Array (2D) 199 of FIG. 1, and illustrate Memory String Pair (MemStrPr) 231 and Memory String Pair (MemStrPr) 239 connected to Bit Line (BL) 281 of FIG. 2. For clarity, the figures illustrate only two memory string pairs, but this description is equally applicable to other numbers of memory string pairs.

FIG. 16A illustrates operation with a search start of one (start searching at the first layer, and since the search depth is one, then search only the first layer). Data to search for is encoded according to a particular encoding technique and stored in IMS cell1-1 1601 and IMS cell256-1 1609. Search criteria includes a search depth indicating one layer and a search start indicating the first layer. The search criteria also includes a search value that is encoded according to the particular encoding (e.g., by Search Encoder 170 of FIG. 1). A portion of the encoded search value is applied to Memory String Pair (MemStrPr) 231 via one word line respectively for each of the left-hand and right-hand memory strings, as illustrated by Vsearch+Vsearch' 1621. Another portion of the encoded search value is applied to Memory String Pair (MemStrPr) 239 via one word line respectively for each of the left-hand and right-hand memory strings, as illustrated by Vsearch+Vsearch' 1622. The remainder of the word lines of the left-hand and the right-hand memory strings of Memory String Pair (MemStrPr) 231 and Memory String Pair (MemStrPr) 239 are driven with a voltage that enables passing current through the left-hand and right-hand memory strings. The enabling voltage is indicated by Vpass+Vpass' 1611 in the figure.

FIG. 16B illustrates operation with a search start of two (start searching at the second layer, and since the search depth is one, then search only the second layer). Operation is similar to FIG. 16A, except that encoded information is provided to the second layer instead of the first layer. Specifically, a portion of the encoded search value is applied to Memory String Pair (MemStrPr) 231 via one word line respectively for each of the left-hand and right-hand memory strings, as illustrated by Vsearch+Vsearch' 1623. Another portion of the encoded search value is applied to Memory String Pair (MemStrPr) 239 via one word line respectively for each of the left-hand and right-hand memory strings, as illustrated by Vsearch+Vsearch' 1624. The remainder of the word lines of the left-hand and the right-hand memory strings of Memory String Pair (MemStrPr) 231 and Memory String Pair (MemStrPr) 239 are driven with a voltage that enables passing current through the left-hand and right-hand memory strings. The enabling voltage is indicated by Vpass+Vpass' 1612 and Vpass+Vpass' 1613 in the figure.

FIG. 16C illustrates operation with a search start of seven (start searching at the seventh layer, and since the search depth is one, then search only the seventh layer). Operation is similar to FIG. 16A, except that encoded information is provided to the seventh layer instead of the first layer. Specifically, a portion of the encoded search value is applied to Memory String Pair (MemStrPr) 231 via one word line respectively for each of the left-hand and right-hand memory strings, as illustrated by Vsearch+Vsearch' 1625. Another portion of the encoded search value is applied to Memory String Pair (MemStrPr) 239 via one word line respectively for each of the left-hand and right-hand memory strings, as illustrated by Vsearch+Vsearch' 1626. The remainder of the word lines of the left-hand and the right-hand memory strings of Memory String Pair (MemStrPr) 231 and Memory String Pair (MemStrPr) 239 are driven with a voltage that enables passing current through the left-hand and right-hand memory strings. The enabling voltage is indicated by Vpass+Vpass' 1614 and Vpass+Vpass' 1615 in the figure.

Figure 17A:
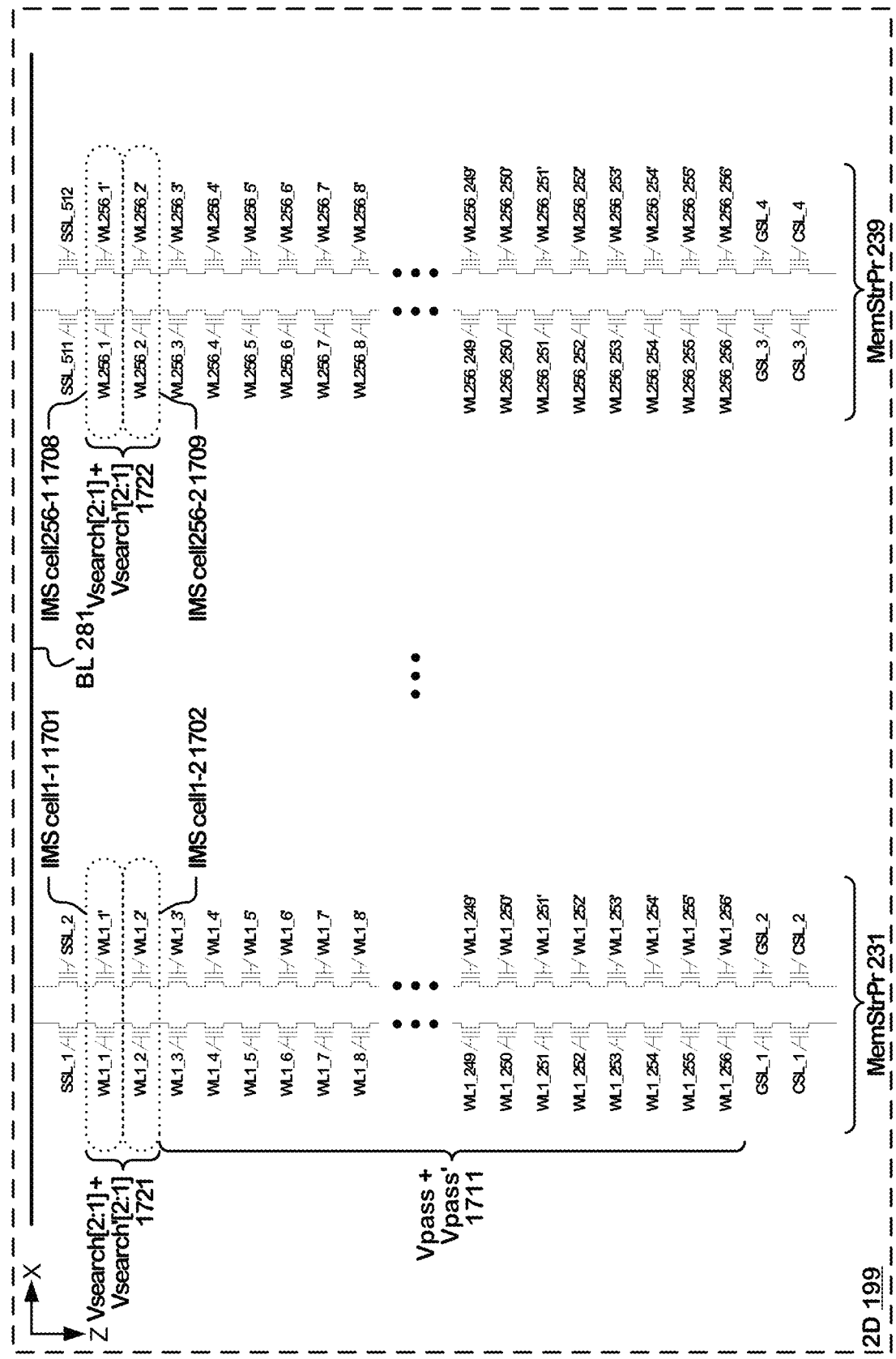
FIGS. 17A, 17B, and 17C illustrate various searching operations according to any of the large-current-mismatch encoding techniques.
Figure 17B:
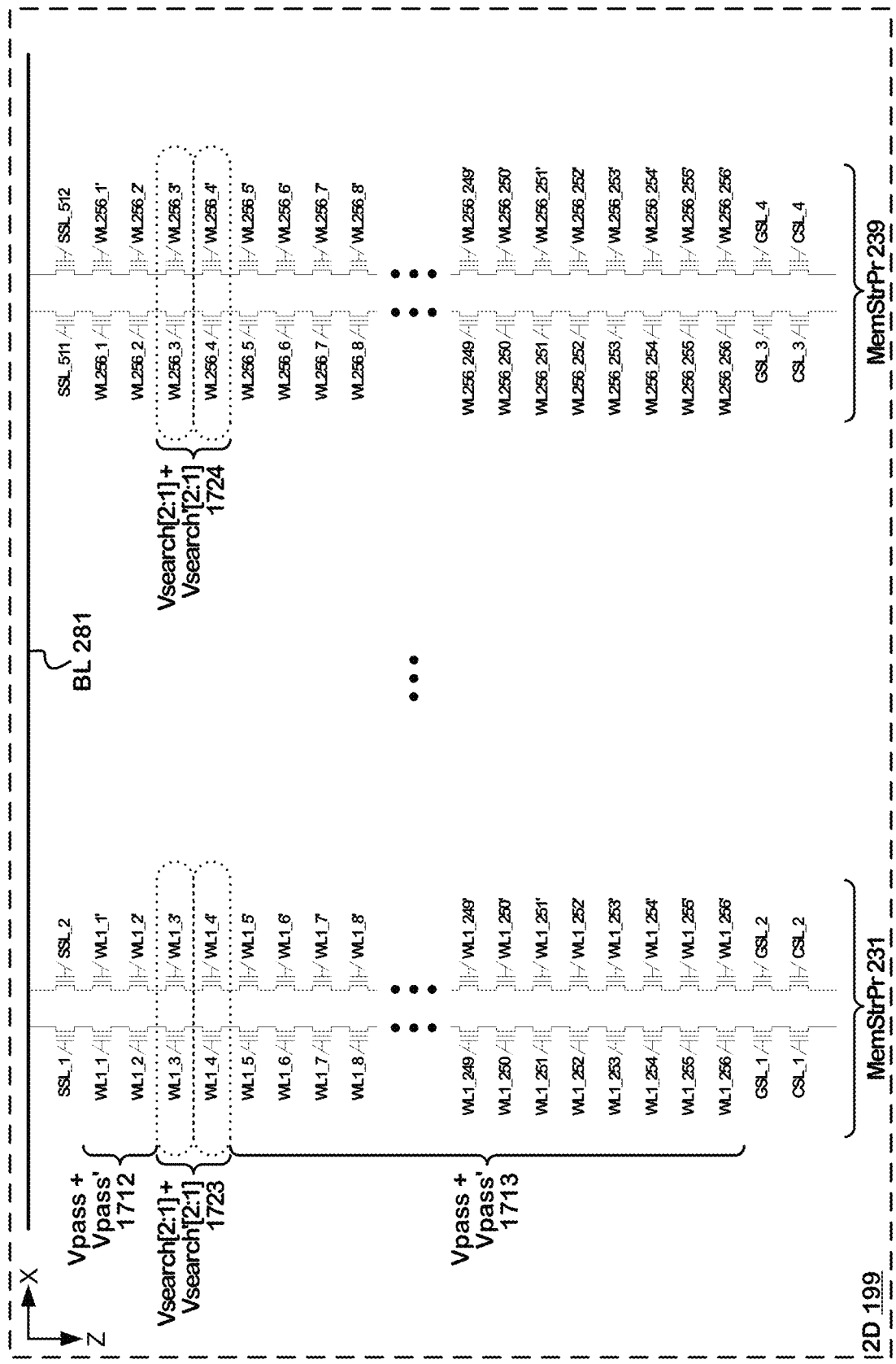
Figure 17C:
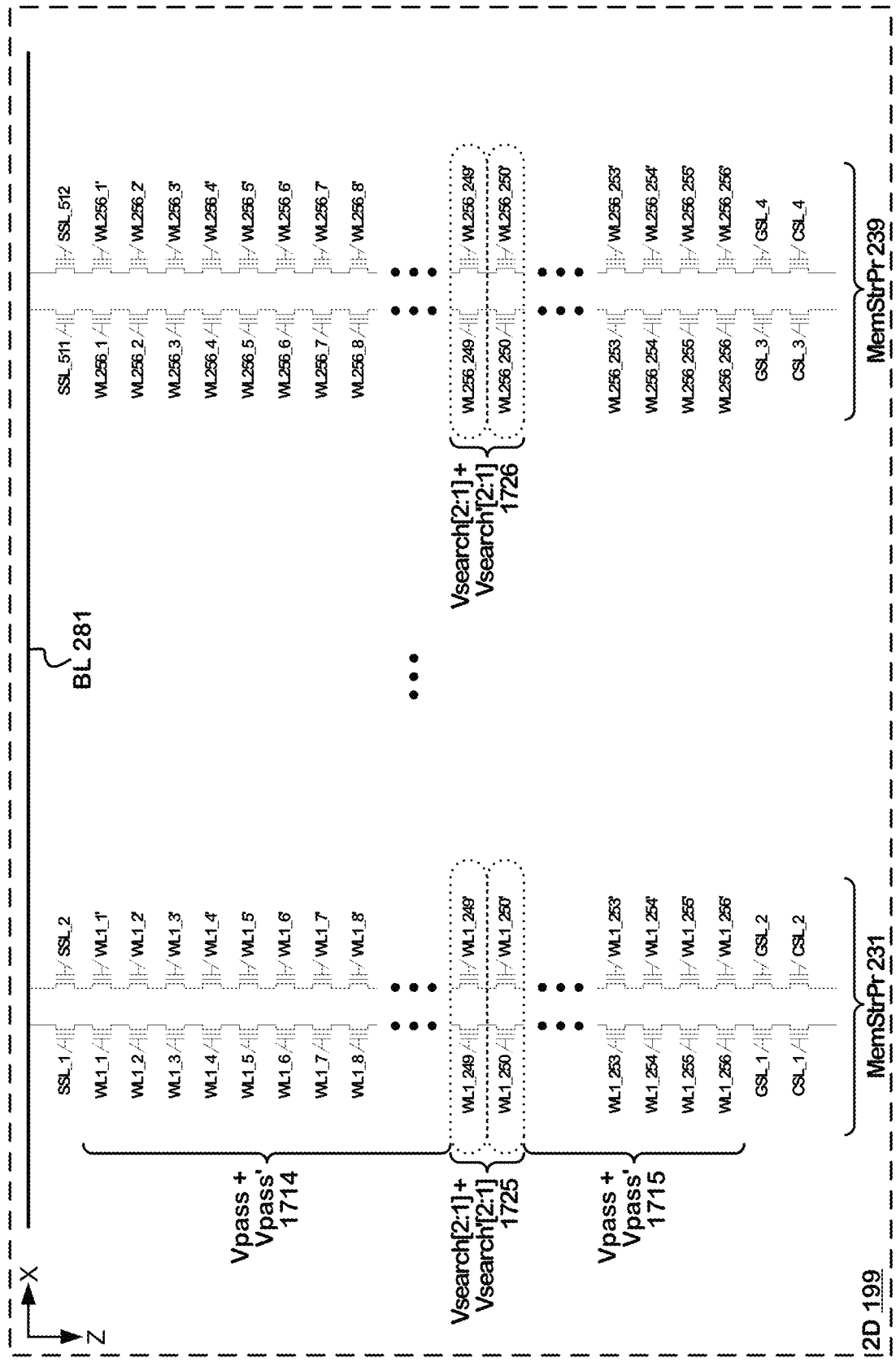

FIGS. 17A, 17B, and 17C illustrate various searching operations according to any of the large-current-mismatch encoding techniques, similar to FIGS. 16A, 16B, and 16C. However, rather than illustrating searches with a search depth of one (as in FIGS. 16A, 16B, and 16C), each of FIGS. 17A, 17B, and 17C illustrates search with a search depth of two (search two layers). The figures differ according to search start (which layer to begin searching). As in FIGS. 16A, 16B, and 16C, FIGS. 17A, 17B, and 17C are in the context of 2D Memory Array (2D) 199 of FIG. 1, and illustrate Memory String Pair (MemStrPr) 231 and Memory String Pair (MemStrPr) 239 connected to Bit Line (BL) 281 of FIG. 2. For clarity, the figures illustrate only two memory string pairs, but this description is equally applicable to other numbers of memory string pairs.

FIG. 17A illustrates operation with a search start of one (start searching at the first layer). Data to search for is encoded according to a particular encoding technique and stored in IMS cell1-1 1701, IMS cell1-2 1702, IMS cell256-1 1708, and IMS cell256-2 1709. Search criteria includes a search depth indicating two layers and a search start indicating the first layer. The search criteria also includes a search value that is encoded according to the particular encoding (e.g., by Search Encoder 170 of FIG. 1). A portion of the encoded search value is applied to Memory String Pair (MemStrPr) 231 via two word lines respectively for each of the left-hand and right-hand memory strings, as illustrated by Vsearch+Vsearch' 1721. Another portion of the encoded search value is applied to Memory String Pair (MemStrPr) 239 via two word lines respectively for each of the left-hand and right-hand memory strings, as illustrated by Vsearch+Vsearch' 1722. The remainder of the word lines are driven with a voltage that enables passing current through the left-hand and right-hand memory strings. The enabling voltage is indicated by Vpass+Vpass' 1711 in the figure.

FIG. 17B illustrates operation with a search start of three (start searching at the third layer). Operation is similar to FIG. 17A, except that encoded information is provided starting at the third layer instead of the first layer. Specifically, a portion of the encoded search value is applied to Memory String Pair (MemStrPr) 231 via one word line respectively for each of the left-hand and right-hand memory strings, as illustrated by Vsearch[2:1]+Vsearch'[2:1] 1723. Another portion of the encoded search value is applied to Memory String Pair (MemStrPr) 239 via one word line respectively for each of the left-hand and right-hand memory strings, as illustrated by Vsearch[2:1]+Vsearch'[2:1] 1724. The remainder of the word lines are driven with a voltage that enables passing current through the left-hand and right-hand memory strings. The enabling voltage is indicated by Vpass+Vpass' 1712 and Vpass+Vpass' 1713 in the figure.

FIG. 17C illustrates operation with a search start of 249 (start searching at the 249th layer). Operation is similar to FIG. 17A, except that encoded information is provided starting at the 249th layer instead of the first layer. Specifically, a portion of the encoded search value is applied to Memory String Pair (MemStrPr) 231 via one word line respectively for each of the left-hand and right-hand memory strings, as illustrated by Vsearch[2:1]+Vsearch'[2:1] 1725. Another portion of the encoded search value is applied to Memory String Pair (MemStrPr) 239 via one word line respectively for each of the left-hand and right-hand memory strings, as illustrated by Vsearch[2:1]+Vsearch'[2:1] 1726. The remainder of the word lines are driven with a voltage that enables passing current through the left-hand and right-hand memory strings. The enabling voltage is indicated by Vpass+Vpass' 1714 and Vpass+Vpass' 1715 in the figure.

Search Encoder 170 of FIG. 1 is enabled to selectively activate SSLs (e.g., any one or more of SSL_1, SSL_2 . . . SSL_511, and SSL_512) as indicated by String Select Lines (SSLs) 171 of FIG. 2, according to a search scope portion of Search 120. The selective activation of SSLs enables tuning a search word, such as provided as a search value of the search criteria. The tuning is usable to mask one or more portions of the search word. For example, all but a single bit of the search word is masked by activating two of the SSLs (e.g., SSL_1 and SSL_2 of Memory String Pair (MemStrPr) 231). For another example, none of the search word is masked (e.g., all characters/digits/bits of the search word are used in searching) by activating all the SSLs. For another example, any one or more portions of the search word are maskable by not activating corresponding ranges of SSLs. Any number of SSLs are activated according to various usage scenarios (e.g., 2, 4, 6, 512, 1024, 2048 or more).

Figure 18A:
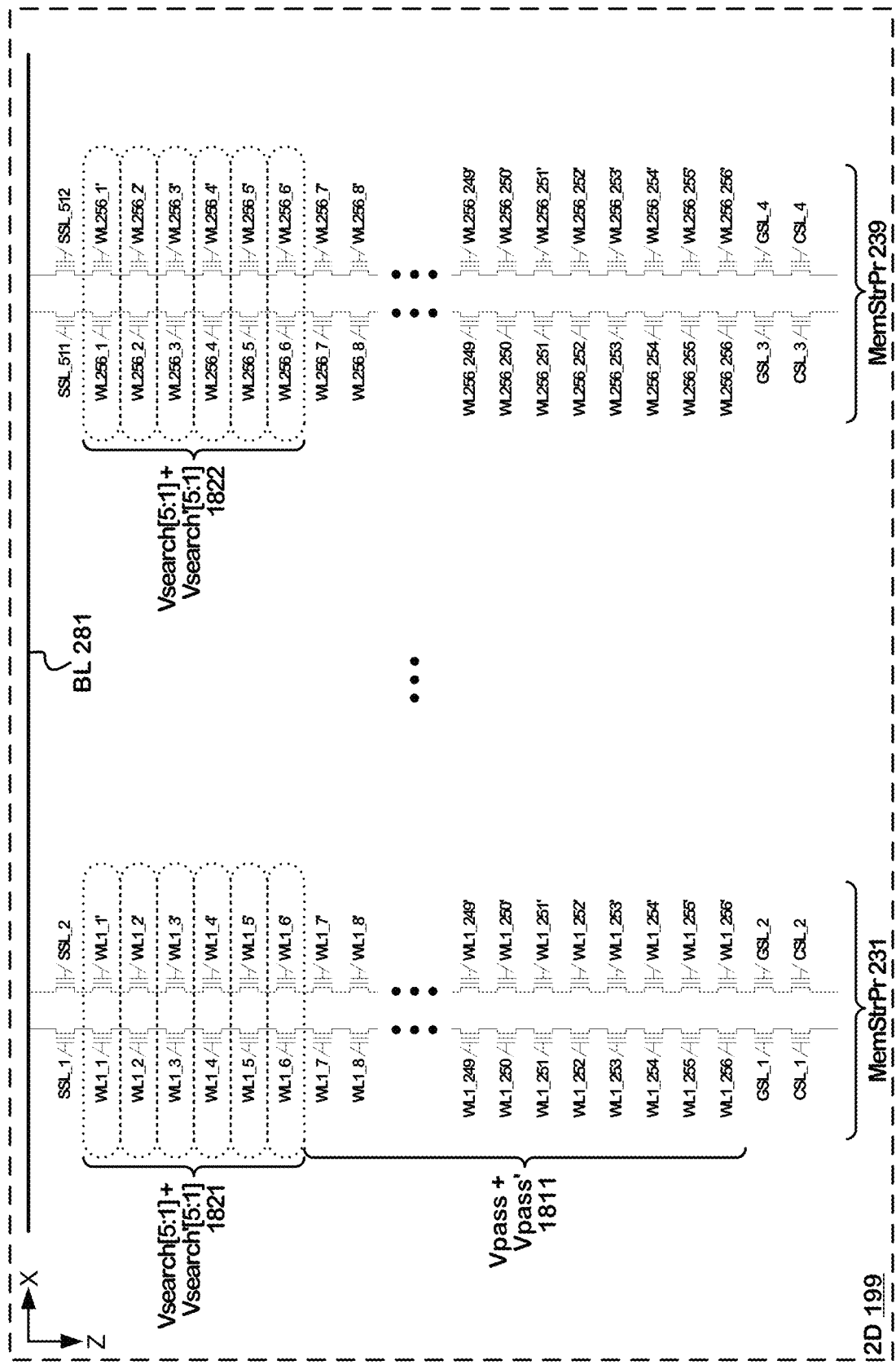
FIGS. 18A and 18B illustrate various searching operations according to any of the large-current-mismatch encoding techniques.
Figure 18B:
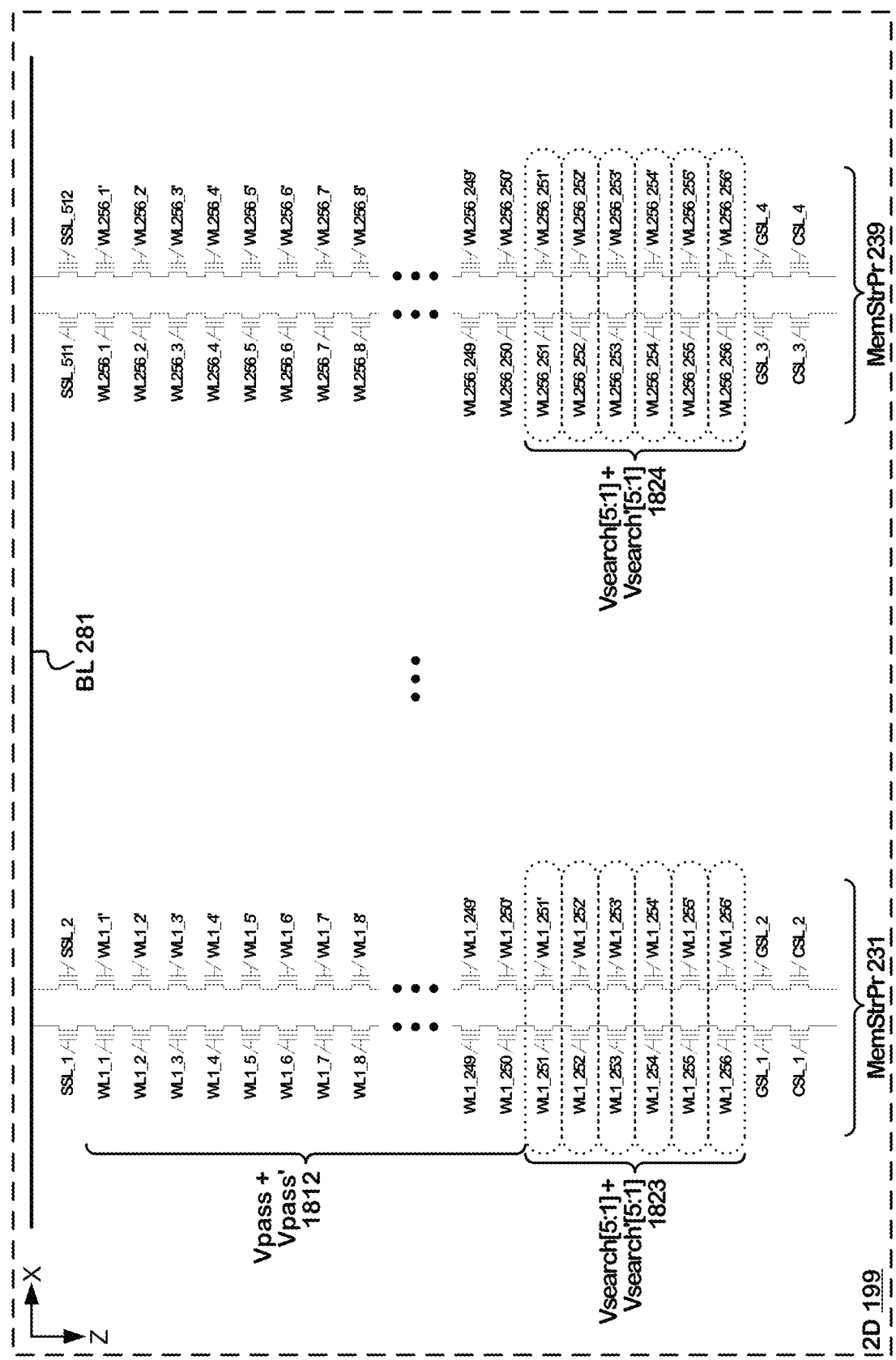

FIGS. 18A and 18B illustrate various searching operations according to any of the large-current-mismatch encoding techniques, similar to FIGS. 16A, 16B, and 16C. However, rather than illustrating searches with a search depth of one (as in FIGS. 16A, 16B, and 16C), each of FIGS. 18A and 18B illustrates a search with a search depth of six (search six layers). The figures differ according to search start (which layer to begin searching). As in FIGS. 16A, 16B, and 16C, FIGS. 18A and 18B are in the context of 2D Memory Array (2D) 199 of FIG. 1, and illustrate Memory String Pair (MemStrPr) 231 and Memory String Pair (MemStrPr) 239 connected to Bit Line (BL) 281 of FIG. 2. For clarity, the figures illustrate only two memory string pairs, but this description is equally applicable to other numbers of memory string pairs.

FIG. 18A illustrates operation with a search start of one (start searching at the first layer). Data to search for is encoded according to a particular encoding technique and stored in the memory devices affected by Vsearch[5:1]+Vsearch'[5:1] 1821 and Vsearch[5:1]+Vsearch'[5:1] 1822. Search criteria includes a search depth indicating six layers and a search start indicating the first layer. The search criteria also includes a search value that is encoded according to the particular encoding (e.g., by Search Encoder 170 of FIG. 1). A portion of the encoded search value is applied to Memory String Pair (MemStrPr) 231 via six word lines respectively for each of the left-hand and right-hand memory strings, as illustrated by Vsearch[5:1]+Vsearch'[5:1] 1821. Another portion of the encoded search value is applied to Memory String Pair (MemStrPr) 239 via six word lines respectively for each of the left-hand and right-hand memory strings, as illustrated by Vsearch[5:1]+Vsearch'[5:1] 1822. The remainder of the word lines are driven with a voltage that enables passing current through the left-hand and right-hand memory strings. The enabling voltage is indicated by Vpass+Vpass' 1811 in the figure.

FIG. 18B illustrates operation with a search start of 251 (start searching at the 251st layer). Data to search for is encoded according to a particular encoding technique and stored in the memory devices affected by Vsearch[5:1]+Vsearch'[5:1] 1823 and Vsearch [5:1]+Vsearch'[5:1] 1824. Operation is similar to FIG. 18A, except that encoded information is provided starting at the 251st layer instead of the first layer. Thus, the last six layers are searched rather than the first six. Specifically, a portion of the encoded search value is applied to Memory String Pair (MemStrPr) 231 via six word lines respectively for each of the left-hand and right-hand memory strings, as illustrated by Vsearch[5:1]+Vsearch'[5:1] 1823. Another portion of the encoded search value is applied to Memory String Pair (MemStrPr) 239 via six word lines respectively for each of the left-hand and right-hand memory strings, as illustrated by Vsearch[5:1]+Vsearch'[5:1] 1824. The remainder of the word lines are driven with a voltage that enables passing current through the left-hand and right-hand memory strings. The enabling voltage is indicated by Vsearch[5:1]+Vsearch'[5:1] 1823 in the figure.

Figure 18C:
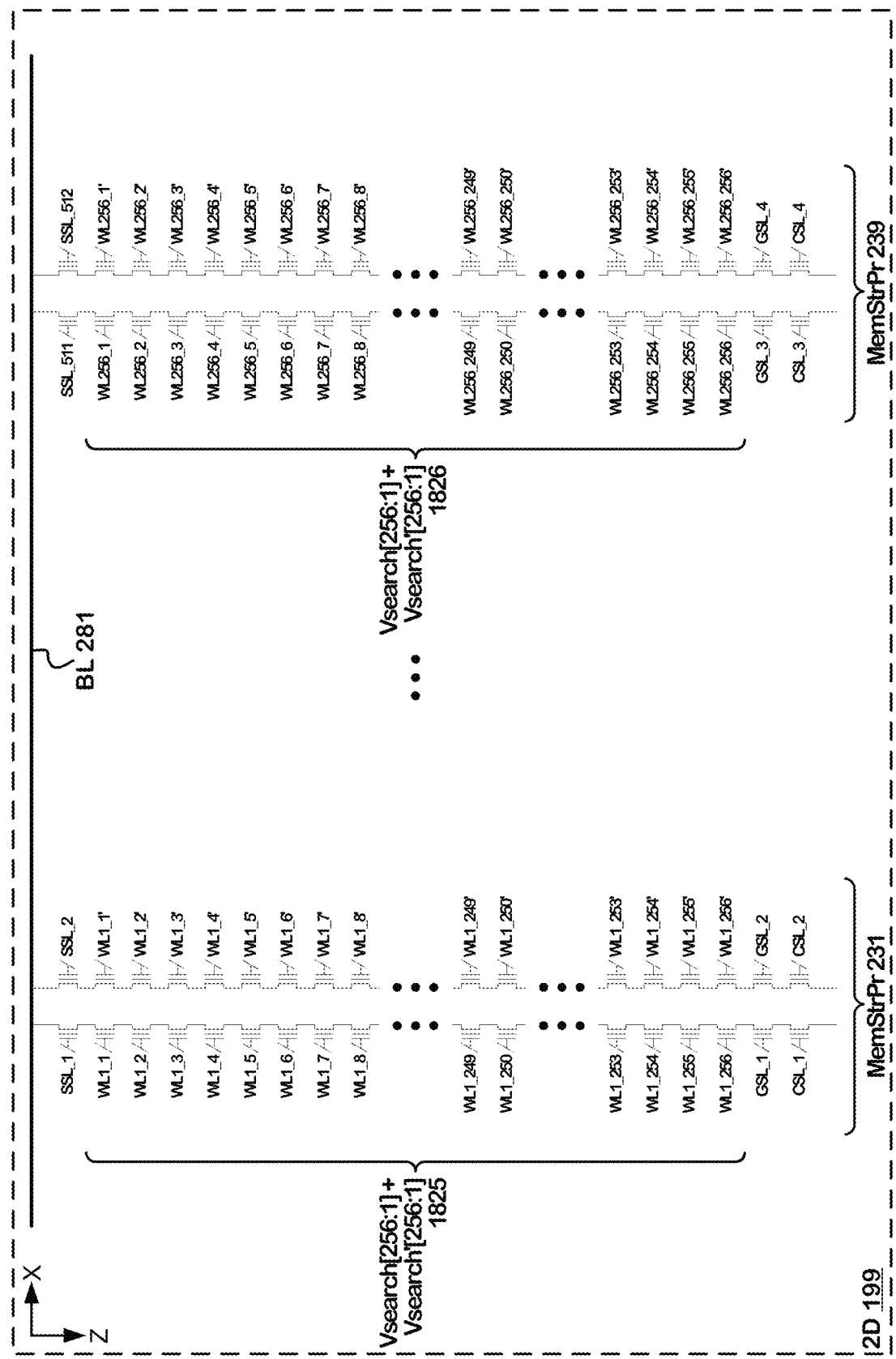
FIG. 18C illustrates various searching operations according to any of the large-current-mismatch encoding techniques.

FIG. 18C illustrates various searching operations according to any of the large-current-mismatch encoding techniques. Data to search for is encoded according to a particular encoding technique and stored in all the memory devices of Memory String Pair (MemStrPr) 231 and Memory String Pair (MemStrPr) 239. Operation is similar to FIG. 18A. However, rather than illustrating searches with a search depth of six (as in FIG. 18A), FIG. 18C illustrates searches with a search depth of 256 (search 256 layers), corresponding, in this example, to all the layers. As in FIG. 18A, FIG. 18C is in the context of 2D Memory Array (2D) 199 of FIG. 1, and illustrates Memory String Pair (MemStrPr) 231 and Memory String Pair (MemStrPr) 239 connected to Bit Line (BL) 281 of FIG. 2. For clarity, the figure illustrates only two memory string pairs, but this description is equally applicable to other numbers of memory string pairs.

3D Memory Search Whole Plane/Chip

Figure 19:
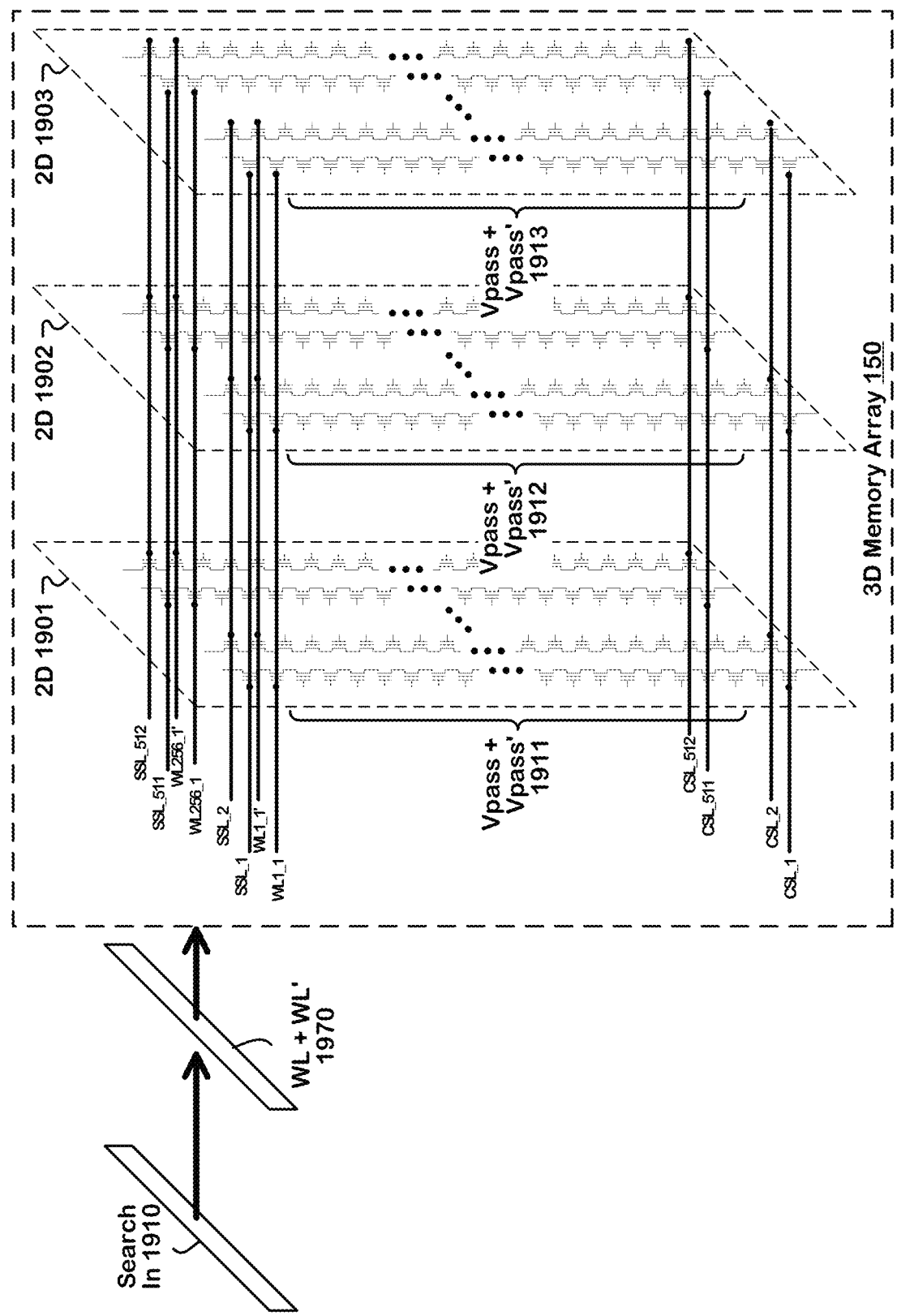
FIG. 19 illustrates a whole-plane or whole-chip search operation.

FIG. 19 illustrates a whole-plane or whole-chip search operation, in the context of 3D Memory Array 150 of FIG. 1. A plurality of 2D memory arrays is illustrated as 2D Memory Array (2D) 1901, 2D Memory Array (2D) 1902, and 2D Memory Array (2D) 1903.

Prior to searching, data to be searched against (e.g., matched against), is encoded according to a particular encoding technique by a data encoder (not illustrated in FIG. 19), such as Data Encoder 160 encoding Data 110 of FIG. 1. For instance, the particular encoding technique is according to any of the encoding techniques as illustrated and described with respect to any of FIGS. 4, 5A, 5B, 6A, 6B, 6C, 7A, 7B, 8, 9A, 9B, 10A, 10B, 10C, 11A, and 11B.

The search criteria includes a search value, a search depth, a search start, and a search scope. The search criteria is indicated by Search In 1910 that is then provided to WL+WL' 1970. Search In 1910 is a representation of Search 120 of FIG. 1. WL+WL' 1970 is an operational representation of Search Encoder 170 of FIG. 1, drawing attention to generating word lines for left and right memory strings of respective memory string pairs, specifically of a single layer.

Search In 1910 includes a search value, and according to the illustrated example, the search value is a 256-character (e.g., 256-digit) search word. WL+WL' 1970 encodes the search word according to the particular encoding and provides an encoded result to drive WL1_1, WL1_1' . . . . WL256_1, and WL256_1', thus enabling a search among the first layer.

Search In 1910 further includes a search depth and search start, collectively indicating that the search is to be one layer deep and to begin at the first layer. Thus, the first layer of word lines (WL1_1, WL1_1' . . . . WL256_1, WL256_1') is driven according to the particular encoding, activating the memory devices of the first layer to participate in the search. The remainder of the word lines of the left-hand and the right-hand memory strings are driven with a voltage that enables passing current from the activated memory devices to the respective bit lines of the 2D memory arrays. The enabling voltage is indicated by Vpass+Vpass' 1911, Vpass+Vpass' 1912, and Vpass+Vpass' 1913 in the figure.

Search In 1910 further includes a search scope, indicating which of the 2D memory arrays to activate to participate in the search. The search scope enables selective activation of all or any portions of the 2D memory arrays via selective activation of SSLs (e.g., SSL_1 . . . . SSL_512). For example, enabling all the SSLs enables searching the entirety of 3D Memory Array 150. Thus, in an implementation with 128K 2D memory arrays, a single search operation enables comparing a 128K-length value at once.

As illustrated by Bit Lines (BLs) 180 of FIG. 1, each of the 2D memory arrays has a respective bit line that is coupled to Page Buffer 130, also of FIG. 1. Page Buffer 130 is enabled (e.g., via sense amplifiers, comparators, priority encoders, and so forth) to detect matching currents to determine which zero or more of the stored data values match as compared to the search value in accordance with the search depth, the search start, and the search scope.

In various implementations, the stored data and the search value are in accordance with 2-level values (e.g., as illustrated and described with respect to any of FIGS. 5A and 5B as well as 9A and 9B), 8-level values (e.g., as illustrated and described with respect to any of FIGS. 6A and 6B as well as 10A-10B), p-level values (e.g., as illustrated and described with respect to any of FIGS. 7A and 7B as well as 11A and 11B), and analog values (e.g., as illustrated and described with respect to FIG. 8).

Figure 20:
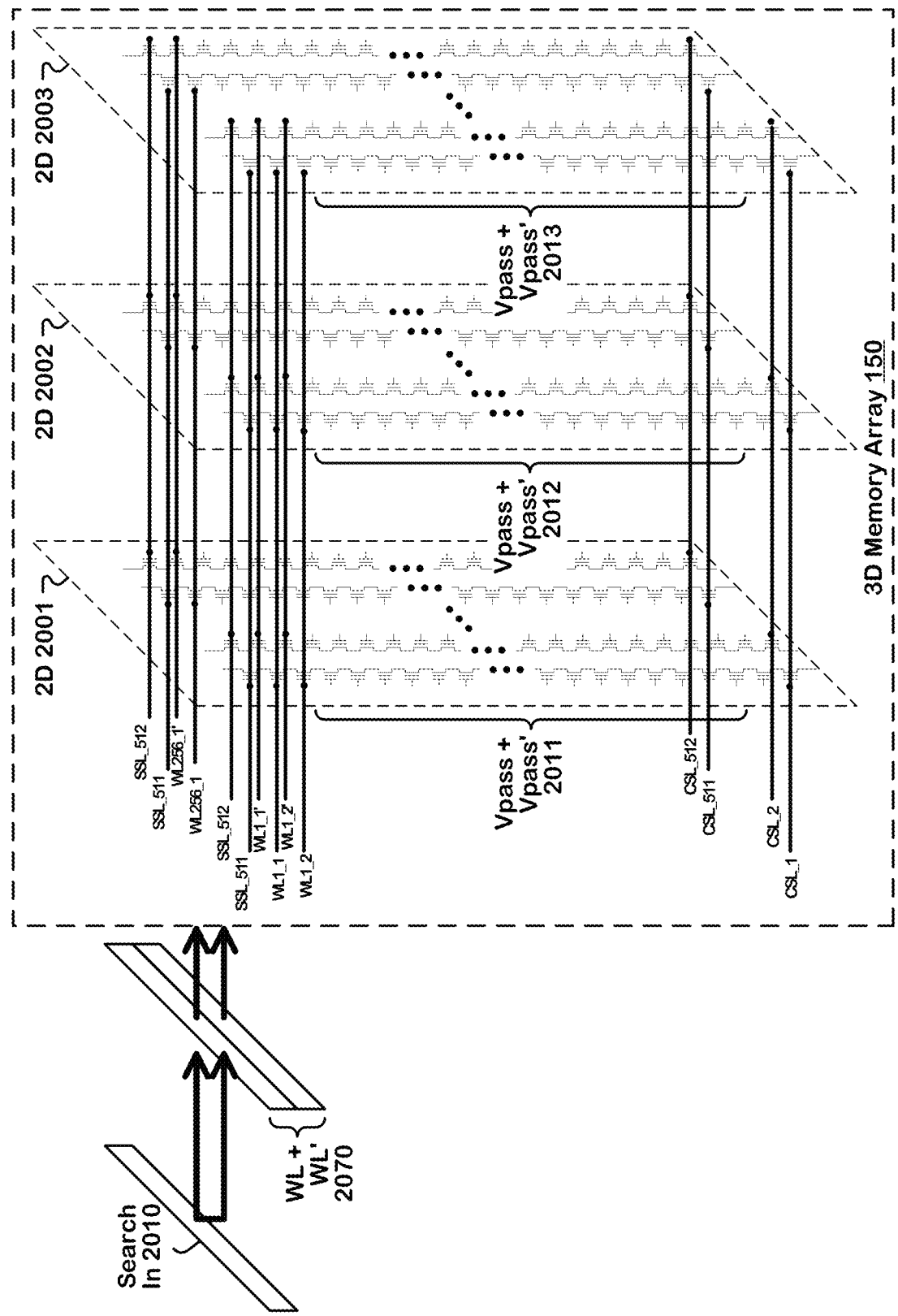
FIG. 20 illustrates a whole-chip search operation.

FIG. 20 illustrates a whole-chip search operation, in the context of 3D Memory Array 150 of FIG. 1. A plurality of 2D memory arrays are illustrated as 2D Memory Array (2D) 2001, 2D Memory Array (2D) 2002, and 2D Memory Array (2D) 2003.

The search operation is similar to FIG. 19, and the following description primarily focuses on differences with respect to FIG. 19. In FIG. 19, the search depth is one, thus WL+WL' 1970 activates a single layer for searching. In FIG. 20, the search depth is two, thus WL+WL' 2070 activates two layers for searching.

As in FIG. 19, prior to searching, data is stored by a data encoder (not illustrated).

Further as in FIG. 19, the search criteria includes a search value, a search depth, a search start, and a search scope. The search criteria is indicated by Search In 2010 that is then provided to WL+WL' 2070. Search In 2010 is a representation of Search 120 of FIG. 1. WL+WL' 2070 is an operational representation of Search Encoder 170 of FIG. 1, drawing attention to generating word lines for left and right memory strings of respective memory string pairs, specifically for two layers.

As in FIG. 19, a 256-character (e.g., 256-digit) search word is the search value included in the search criteria.

Search In 2010 includes a search value, and according to the illustrated example, the search value is the 256-character (e.g., 256-digit) search word.

WL+WL' 2070 encodes the search word according to the particular encoding and provides an encoded result to drive WL1_1, WL1_1' . . . . WL256_1, and WL256_1' as well as WL1_2, WL1_2' . . . . WL256_2, and WL256_2', thus enabling a search among the first and the second layers.

Search In 2010 further includes a search depth and search start, collectively indicating that the search is to be two layers deep and to begin at the first layer. Thus, the first layer of word lines (WL1_1, WL1_1' . . . . WL256_1, WL256_1') and the second layer of word lines (WL1_2, WL1_2' . . . . WL256_2, and WL256_2') are driven according to the particular encoding, activating the memory devices of the first and the second layers to participate in the search. The remainder of the word lines of the left-hand and the right-hand memory strings are driven with a voltage that enables passing current from the activated memory devices to the respective bit lines of the 2D memory arrays. The enabling voltage is indicated by Vpass+Vpass' 2011, Vpass+Vpass' 2012, and Vpass+Vpass' 2013 in the figure.

Search In 2010 further includes a search scope and in this context enables activation of all the 2D memory arrays via activation of all SSLs (e.g., SSL_1 . . . SSL_512).

As in FIG. 19, the 2D memory arrays of FIG. 20 have bit lines that are coupled to Page Buffer 130 of FIG. 1 to determine which zero or more of the stored data values match as compared to the search value in accordance with the search depth, search start, and search scope.

Also as in FIG. 19, in various implementations, in FIG. 20 the stored data and search values are in accordance with 2-level values, p-level values, and analog values.

Figure 21:
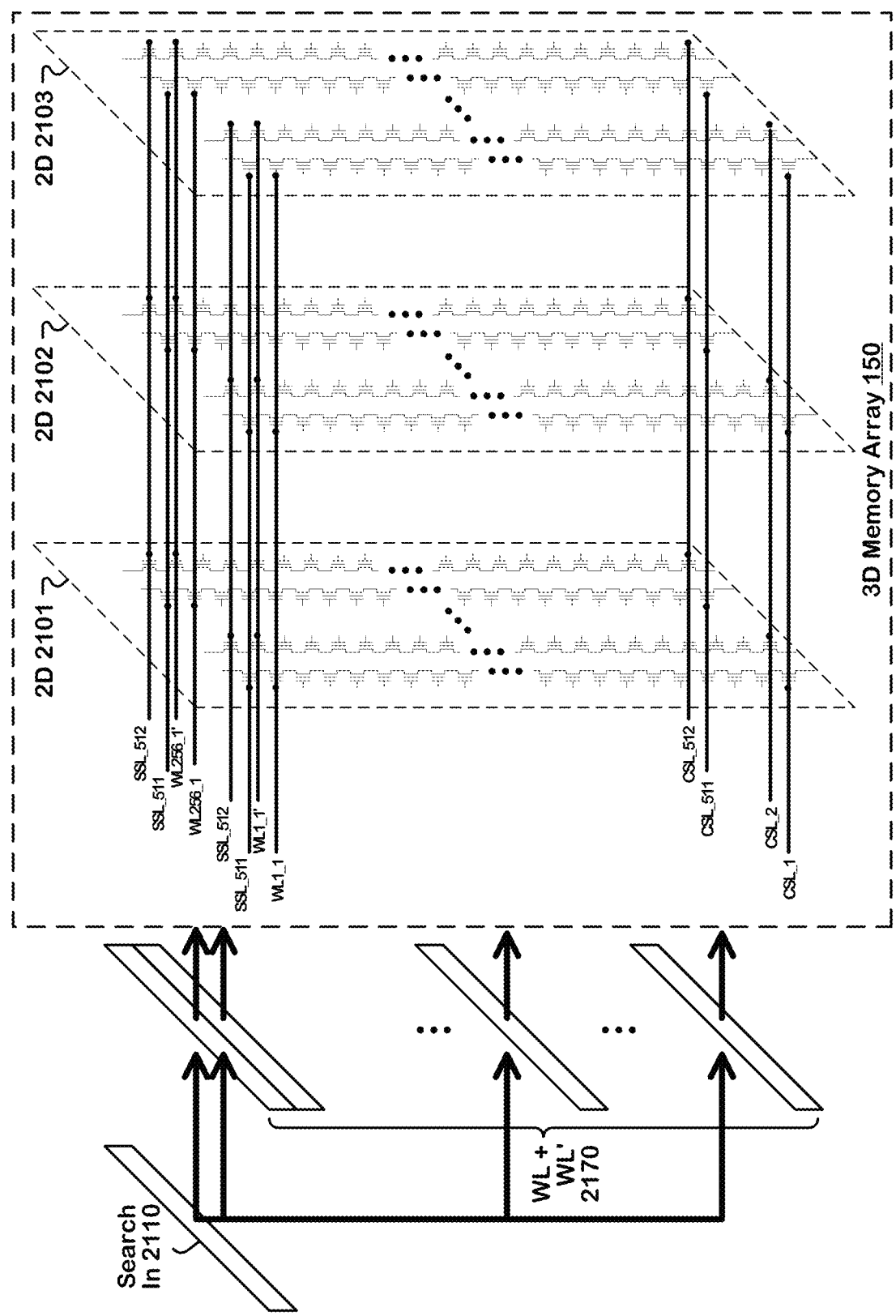
FIG. 21 illustrates a whole-chip search operation.

FIG. 21 illustrates a whole-chip search operation, in the context of 3D Memory Array 150 of FIG. 1. A plurality of 2D memory arrays is illustrated as 2D Memory Array (2D) 2101, 2D Memory Array (2D) 2102, and 2D Memory Array (2D) 2103.

The search operation is similar to FIG. 19 and FIG. 20. Rather than searching one or two layers, however, FIG. 20 illustrates searching all layers of 3D Memory Array 150.

The search depth of the search criteria indicates all layers. Therefore, there is no generation of Vpass as in FIG. 19 and FIG. 20. Instead, WL+WL' 2170 encodes the search word from Search In 2110 according to the particular encoding and provides an encoded result to drive WL1_1, WL1_1' . . . . WL256_1, and WL256_1' as well as WL1_256, WL1_256' . . . WL256_256, and WL256_256', thus enabling search among the 256 layers of 3D Memory Array 150. The encoded result provided is identical for each of the layers, as conceptually indicated by replication from Search In 2110 to WL+WL' 2170.

The search scope indicates the whole chip, so WL+WL' 2170 enables activation of all the 2D memory arrays via activation of all SSLs (e.g., SSL_1 . . . SSL_512).

As in FIG. 19 and FIG. 20, the 2D memory arrays of FIG. 21 have bit lines that are coupled to Page Buffer 130 of FIG. 1 to determine which zero or more of the stored data values match as compared to the search value in accordance with the search depth, search start, and search scope.

Also as in FIG. 19 and FIG. 20, in various implementations, in FIG. 21 the stored data and search values are in accordance with 2-level values, p-level values, and analog values.

Other usage scenarios enable activation of any number of layers so the search depth is variable from one to however many layers are present. Further, the search start is variable from one to however many layers are present to indicate starting from any layer from the first to the last. In some implementations, a plurality of search depth and/or search start indicators enable search a plurality of non-contiguous layers of 3D Memory Array 150.

3D Memory Search Operation

Figure 22:
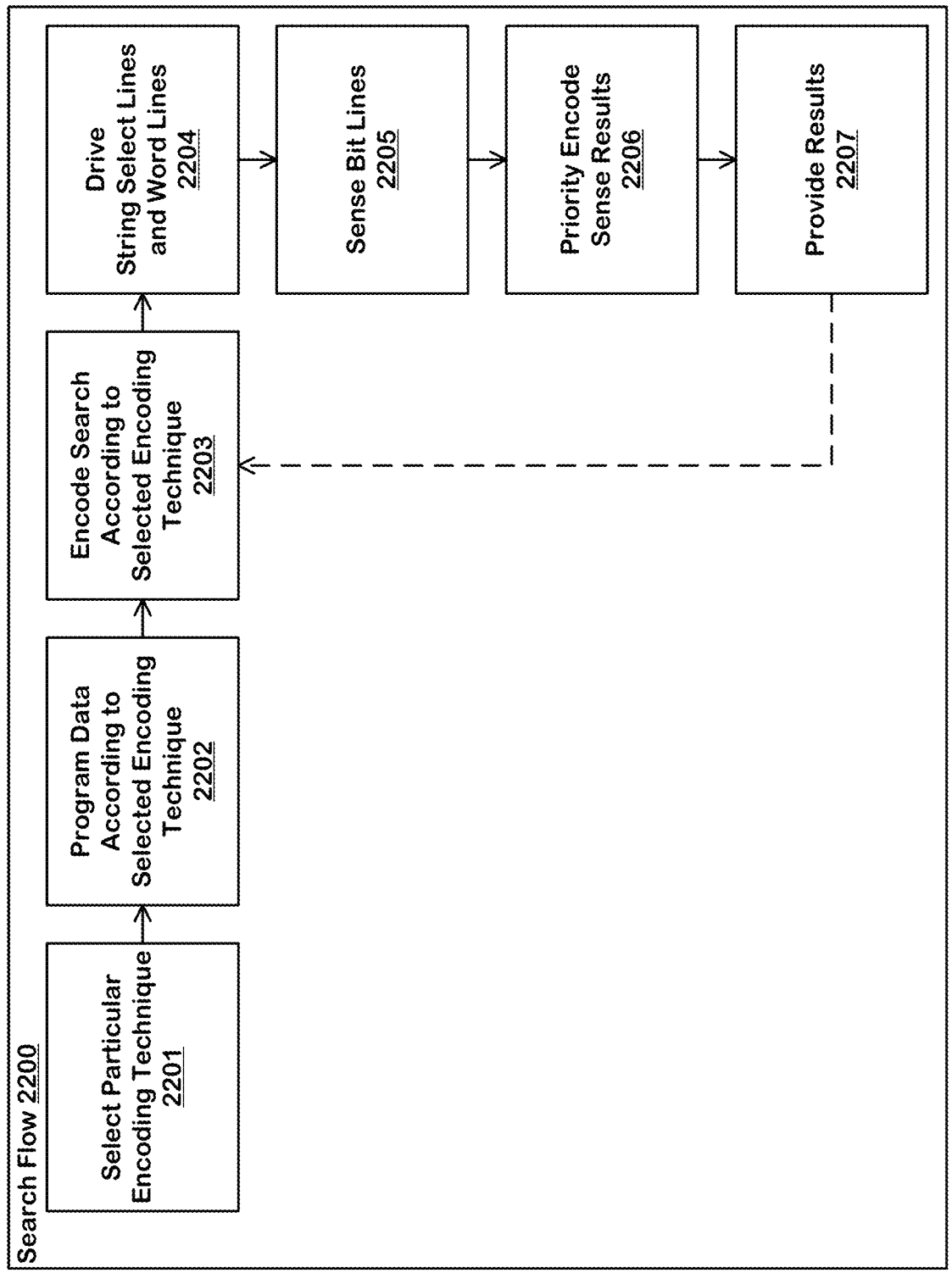
FIG. 22 illustrates an example operating flow for a 3D searching memory.

FIG. 22 illustrates an example operating flow for a 3D searching memory (for example 3D Searching Memory 100 of FIG. 1), as Search Flow 2200.

Flow begins at Select Particular Encoding Technique 2201. The particular encoding technique is used for programming data and searching.

Flow then proceeds to Program Data According to Selected Encoding Technique 2202. For example, with respect to FIG. 1, Data Encoder 160 receives Data 110, encodes it according to the particular encoding technique, and provides Encoded Data 111 to 3D Memory Array 150 for programming as stored data to be searched against.

Flow then proceeds to Encode Search According to Selected Encoding Technique 2203. Continuing with the example, Search Encoder 170 receives Search 120, encodes a search value therein according to the particular encoding technique, and provides Word Lines (WLs, WL's) 172 to 3D Memory Array 150 for searching. Search 120 optionally includes one or more of a search depth, a search start, and a search scope. Search Encoder 170 uses the search start, if provided, to determine which layers to encode the search value with respect to Word Lines (WLs, WL's) 172. Search Encoder 170 uses the search depth and/or the search start, if provided, to "override" all or any portions of Word Lines (WLs, WL's) 172 with a voltage to enable passing current in memory strings, irrespective of threshold voltages. Search Encoder 170 uses the search scope, if provided, to determine which SSLs to activate, as provided on String Select Lines (SSLs) 171 to 3D Memory Array 150.

Flow then proceeds to Drive String Select Lines and Word Lines 2204. Continuing with the example, circuitry in Search Encoder 170 and/or 3D Memory Array 150 drives information provided via String Select Lines (SSLs) 171 and Word Lines (WLs, WL's) 172 to SSLs and word lines, respectively, of the 2D memory arrays of 3D Memory Array 150.

Flow then proceeds to Sense Bit Lines 2205. Continuing with the example, circuitry (e.g., one or more sense amplifiers and/or comparators) in 3D Memory Array 150 and/or Page Buffer 130 sense bit lines responsive to driving the SSLs and word lines and subsequent currents on the bit lines as effected by the memory devices.

Flow then proceeds to Priority Encode Sense Results 2206. Continuing with the example, one or more priority encoders of Page Buffer 130 determine, from results of the bit line sensing, which zero or more of the stored data values match as compared to the search value, in accordance with the search depth, search start, and search scope.

Flow then proceeds to Provide Results 2207. The results are provided, for example, to a host agent. Flow then optionally proceeds back to encode a next search (Encode Search According to Selected Encoding Technique 2203).

3D Memory Search Additional Information

Example memory technologies applicable to memory arrays of non-volatile 3D memory search architecture as disclosed herein include floating-gate, split-gate, SONOS, floating dot, DRAM, DRAM-like (e.g., 2T0C), FeFET, and any memory technology compatible with search via word lines and bit lines. Exemplary SONOS memory technology (sometimes referred to as charge trap memory) uses an insulating layer (e.g., of silicon nitride) with traps to capture and retain charge as injected from a channel. Exemplary floating dot memory technology conceptually replaces a floating gate with a floating silicon nanodot or embeds floating silicon nanodots in a polysilicon gate. Exemplary 2T0C memory technology uses parasitic capacitance of a read transistor to store charge rather than an explicit storage capacitor. Exemplary FeFET memory technology uses permanent electrical field polarization of ferroelectric material embedded between a gate and a source-gate conduction region to store information. Example memory structures applicable to non-volatile 3D memory search architecture include 2D structures (e.g., 2D flash structures) and 3D structures (e.g., 3D flash structures). Example array architectures applicable to non-volatile 3D memory search architecture include NOR/OR-type array architectures and AND/NAND-type array architectures.

It is understood that the foregoing disclosure presents implementations, variations, embodiments, and examples in an intended illustrative sense rather than in a limiting sense. It is contemplated that modifications and combinations are discernible that will be within the spirit of the disclosure and the scope of the following claims. What is claimed is:

The invention claimed is:

1. A computing system comprising:
   a bit line and a source line;
   a pair of memory strings comprising a first memory string and a second memory string connected in parallel between the bit line and the source line, wherein the first memory string comprises at least one select device that is responsive to a select input and that is series-connected with a plurality of series-connected programmable devices, each being responsive to a respective programmed state and a respective control input, and wherein the second memory string is identical to the first memory string;
   a sense amplifier connected to the bit line and enabled to provide an indication of one of a plurality of matching indications;

data encoding circuitry enabled to provide programming data to the programmable devices of the first memory string and the second memory string responsive to at least one data input and in accordance with a selected encoding; and search encoding circuitry enabled (i) to drive the select inputs of the first memory string and the second memory string responsive to a search scope of search criteria and (ii) to drive, in accordance with the selected encoding, the control inputs responsive to a search value of the search criteria, wherein the pair of memory strings is enabled to couple the bit line and the source line via a respective one of a plurality of string pair currents responsive to the select inputs, the control inputs, and the programmed states of the first memory string and the second memory string, wherein the string pair currents comprise an exact-match current and a no-match current, and wherein the matching indications comprise an exact-match that is indicated responsive to the exact-match current and a no-match that is indicated responsive to the no-match current.

2. The computing system of claim 1, wherein the string pair currents further comprise at least one partial-match current, and the matching indications further comprise at least one partial-match that is indicated responsive to the at least one partial-match current.

3. The computing system of claim 1, wherein the plurality of series-connected programmable devices is arranged in a plurality of layers, the search encoding circuitry is further enabled to drive the select inputs of the first memory string and the second memory string responsive to a search depth of the search criteria, and the search depth indicates how many of the layers to search.

4. The computing system of claim 3, wherein the search encoding circuitry is further enabled to drive the select inputs of the first memory string and the second memory string responsive to a search start of the search criteria, and the search start indicates which of the layers to begin to search.

5. The computing system of claim 1, further comprising a page buffer comprising a plurality of sense amplifiers one of which is the sense amplifier, and wherein the page buffer further comprises a priority encoder enabled to priority encode match results of the plurality of sense amplifiers.

6. The computing system of claim 1, wherein the exact-match current is larger than the no-match current.

7. The computing system of claim 1, wherein the exact-match current is smaller than the no-match current.

8. The computing system of claim 1, wherein each programmable device of the plurality of series-connected programmable devices is programmable via adjustment of a respective threshold voltage to one of at least two threshold levels, the selected encoding indicates respectively how to encode a binary zero and a binary one to two respective ones of the at least two threshold levels, and the at least two threshold levels are mutually distinguishable.

9. The computing system of claim 1, wherein each programmable device of the plurality of series-connected programmable devices is programmable via adjustment of a respective threshold voltage to one of at least eight threshold levels, the selected encoding indicates respectively how to encode an octal zero, an octal one, an octal two, an octal three, an octal four, an octal five, an octal six, and an octal seven to eight respective ones of the at least eight threshold levels, and the at least eight threshold levels are mutually distinguishable.

10. The computing system of claim 1, wherein each programmable device of the plurality of series-connected programmable devices is programmable via adjustment of a respective threshold voltage to one of a plurality of analog threshold levels, the selected encoding indicates respectively how to encode respective analog data values to respective ones of the analog threshold levels, and the analog threshold levels are mutually distinguishable.

11. The computing system of claim 1, further comprising a plurality of memory string pairs each identical to the pair of memory strings and connected in parallel between the bit line and the source line, and wherein the data encoding circuitry is further enabled, responsive to the at least one data input and in accordance with the selected encoding, to provide additional programming data (1) to the programmable devices of the first memory string of the plurality of memory string pairs, and (2) to the programmable devices of the second memory string of the plurality of memory string pairs.

12. The computing system of claim 11, further comprising a plurality of 2D memory arrays, a first of which comprises the plurality of memory string pairs and the pair of memory strings.

13. The computing system of claim 12, further comprising a plurality of sense amplifiers including the sense amplifier, wherein each of the bit lines of the 2D memory arrays is connected to a respective one of the plurality of sense amplifiers.

14. The computing system of claim 13, further comprising a page buffer that comprises a priority encoder enabled to priority encode match results of the plurality of sense amplifiers.

15. A computing method comprising:
receiving at least one data input;
receiving search criteria comprising a search scope and a search value;
providing programming data, in accordance with a selected encoding, to programmable devices of a first memory string and a second memory string responsive to the at least one data input;
driving select inputs of the first memory string and the second memory string responsive to the search scope;
driving control inputs of the first memory string and the second memory string in accordance with the selected encoding and responsive to the search value;
sensing a bit line to provide an indication of one of a plurality of matching indications, and wherein the first memory string and the second memory string are connected in parallel between the bit line and a source line;
providing the indication as an output,
wherein a pair of memory strings comprises the first memory string and the second memory string, the first memory string comprising at least one select device that is responsive to one of the select inputs and that is series-connected with a plurality of series-connected programmable devices, each being responsive to a respective programmed state and a respective one of the control inputs, and the second memory string being identical to the first memory string,
wherein the pair of memory strings is enabled to couple the bit line and the source line via a respective one of a plurality of string pair currents responsive to the select inputs, the control inputs, and programmed states of the first memory string and the second memory string, wherein the string pair currents comprise an exact-match current and a no-match current, and wherein the matching indications comprise an exact-match that is indicated responsive to the exact-match current and a no-match that is indicated responsive to the no-match current.

16. The computing method of claim 15, wherein the string pair currents further comprise a partial-match current, and the matching indications further comprise a partial-match that is indicated responsive to the partial-match current.

17. The computing method of claim 15, wherein the plurality of series-connected programmable devices is arranged in a plurality of layers, the search criteria further comprises a search depth, the driving the control inputs is further responsive to the search depth, and the search depth indicates how many of the layers to search.

18. A search memory comprising:
a plurality of sense amplifiers;
a plurality of two-dimensional memory arrays each comprising:
a respective bit line connected to a respective one of the sense amplifiers,
a respective source line, and
a respective plurality of memory strings each coupled to (a) the respective bit line and (b) the respective source line, and each memory string comprising (1) a respective plurality of series-connected floating-gate transistors each having and being responsive to (c) a respective configured state and (d) a respective control input, and further comprising (2) a respective select device connected in series between the respective plurality of series-connected floating-gate transistors and the respective bit line, and wherein each select device has and is responsive to a respective select line;
a plurality of word lines each coupled to a respective one of the respective control inputs of each of the series-connected floating-gate transistors;
a data encoder enabled to provide programming data to the series-connected floating-gate transistors and responsive to at least one data input and in accordance with a selected encoding;
a search encoder enabled to receive a search and drive the word lines according to the search and the selected encoding, and further enabled to drive the select lines according to the search; and wherein (e) each respective memory string is enabled to drive the respective bit line and source line that the respective memory string is coupled to via a match-found current responsive to the configured states of the memory string exactly matching the respective control inputs of the series-connected floating-gate transistors of the memory string, and (f) each sense amplifier is enabled to generate a respective indication of whether the bit line it is coupled to is coupled to the source line via the match-found current; and wherein (g) each memory string is further enabled to couple the respective bit line and source line that the memory string is coupled to via a no-match-found current responsive to the configured states of the memory string not exactly matching the respective control inputs of the series-connected floating-gate transistors of the memory string, and (h) each sense amplifier is further enabled to generate a respective indication of whether the bit line it is coupled to is coupled to the source line via the no-match-found current.

19. The search memory of claim 18, wherein each respective memory string is further enabled to couple the respective bit line and source line that the respective memory string is coupled to via a partial-match-found current that is responsive to the configured states of the respective memory string partially exactly matching the respective control inputs of the series-connected floating-gate transistors of the respective memory string, and each sense amplifier is further enabled to generate a respective indication of whether the bit line it is coupled to is coupled to the source line via the partial-match-found current.

20. The search memory of claim 18, wherein the series-connected floating-gate transistors are arranged in a plurality of layers, the search encoder is further enabled to drive the select lines responsive to a search depth of the search, and the search depth indicates how many of the layers to search.

* * * * *